(12) United States Patent
Miyamoto et al.

(10) Patent No.: US 7,739,603 B2
(45) Date of Patent: Jun. 15, 2010

(54) SIGNAL ROUTING APPARATUS AND SIGNAL ROUTING PROGRAM

(75) Inventors: Hiromu Miyamoto, Hamamatsu (JP); Kei Nakayama, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1125 days.

(21) Appl. No.: 11/132,915

(22) Filed: May 18, 2005

(65) Prior Publication Data
US 2005/0266712 A1     Dec. 1, 2005

(30) Foreign Application Priority Data
May 26, 2004   (JP)   ............... 2004-156345

(51) Int. Cl.
*G06F 15/177* (2006.01)
(52) U.S. Cl. ............... 715/735; 715/734; 715/711; 709/220; 709/221; 709/222
(58) Field of Classification Search ............ 715/771, 715/734, 735, 772; 709/220, 221, 222; 439/260
See application file for complete search history.

(56) References Cited

U.S. PATENT DOCUMENTS

| | | | |
|---|---|---|---|
| 5,331,111 A | | 7/1994 | O'Connell |
| 5,694,562 A | * | 12/1997 | Fisher ............... 715/839 |
| 5,990,891 A | | 11/1999 | Fukaya et al. |
| 6,972,765 B1 | * | 12/2005 | Duplat ............... 345/473 |
| 2001/0052946 A1 | * | 12/2001 | Sato ............... 348/706 |
| 2002/0052941 A1 | * | 5/2002 | Patterson ............... 709/223 |
| 2003/0176930 A1 | * | 9/2003 | Nold ............... 700/17 |
| 2003/0184595 A1 | * | 10/2003 | Kodosky et al. ............ 345/810 |

(Continued)

FOREIGN PATENT DOCUMENTS

JP          06-180730 A          6/1994

(Continued)

OTHER PUBLICATIONS

OUTSIM: "SynthMaker. Quick St art Guide. Version 0.9.oH" [Online], Jan. 28, 2005, Retrieved from the Internet: URL: http://web.archive.org./web/20050128141046/http://synthmaker.com/Quick+Start.pdf.

(Continued)

*Primary Examiner*—Weilun Lo
*Assistant Examiner*—Tuyetlien T Tran
(74) *Attorney, Agent, or Firm*—Morrison & Foerster LLP

(57) ABSTRACT

A signal routing apparatus is designed for setting a signal route among a plurality of components of a signal processing system by means of graphic user interface. In the signal processing apparatus, a display part displays a plurality of components each having at least one terminal for connection. An operator part is operated to select at least one terminal of one component on the display part and to input an instruction for connection. A detection part responds to the instruction for detecting at least one terminal of another component, which can be connectable to the selected terminal. A connection part automatically connects the selected terminal of one component and the detected terminal of another component with one another so that a line is drawn on the display part between the selected terminal and the detected terminal, thereby setting the signal route among the components in the form of lines drawn between the terminals of the components on the display part.

18 Claims, 13 Drawing Sheets

U.S. PATENT DOCUMENTS

| | | |
|---|---|---|
| 2003/0222872 A1 | 12/2003 | Lin et al. |
| 2004/0055006 A1* | 3/2004 | Iwamura ..................... 725/37 |
| 2004/0261029 A1* | 12/2004 | Skjaervik ................... 715/734 |
| 2005/0044502 A1* | 2/2005 | Fu ............................. 715/734 |
| 2005/0197809 A1* | 9/2005 | Dowski et al. ................ 703/6 |

FOREIGN PATENT DOCUMENTS

| | | |
|---|---|---|
| JP | 10-154055 A | 6/1998 |
| WO | WO-02/00343 A2 | 1/2002 |

OTHER PUBLICATIONS

Notification of Reasons for Refusal mailed Mar. 31, 2009, for JP Patent Application No. 2004-156345, with English Translation, 13 pages.

* cited by examiner

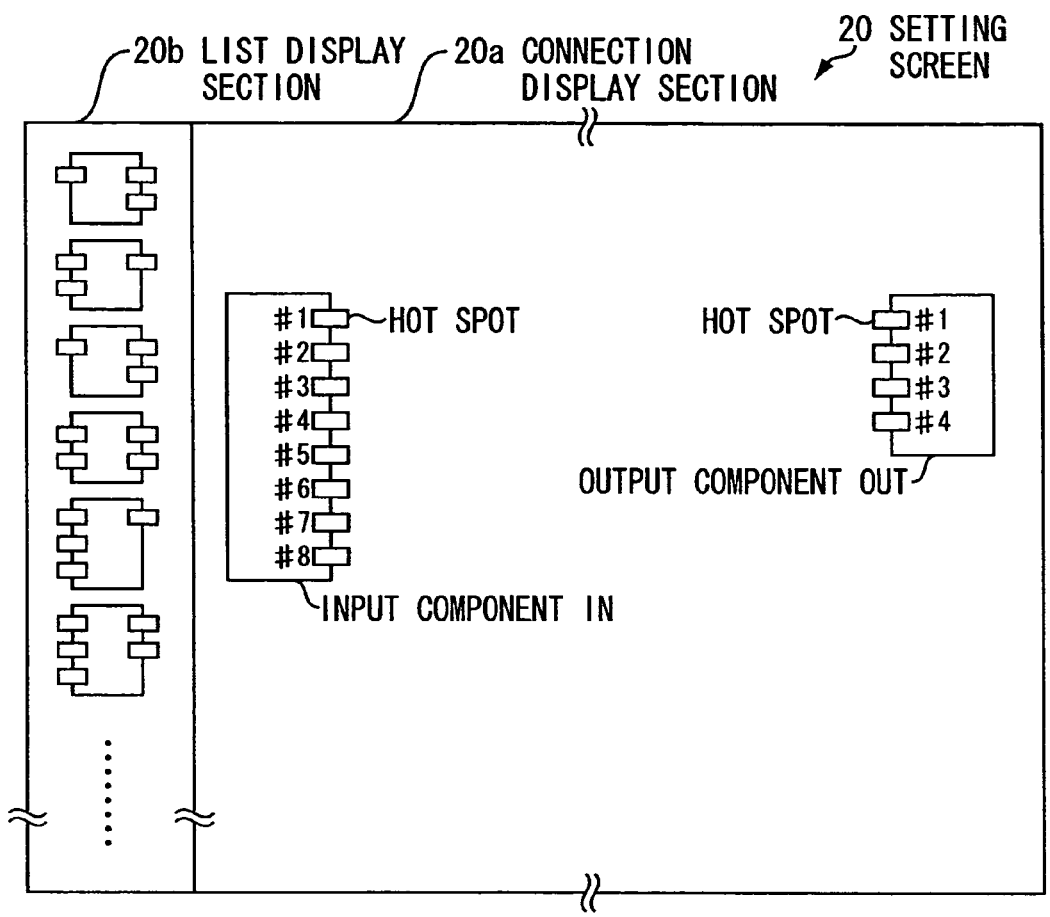

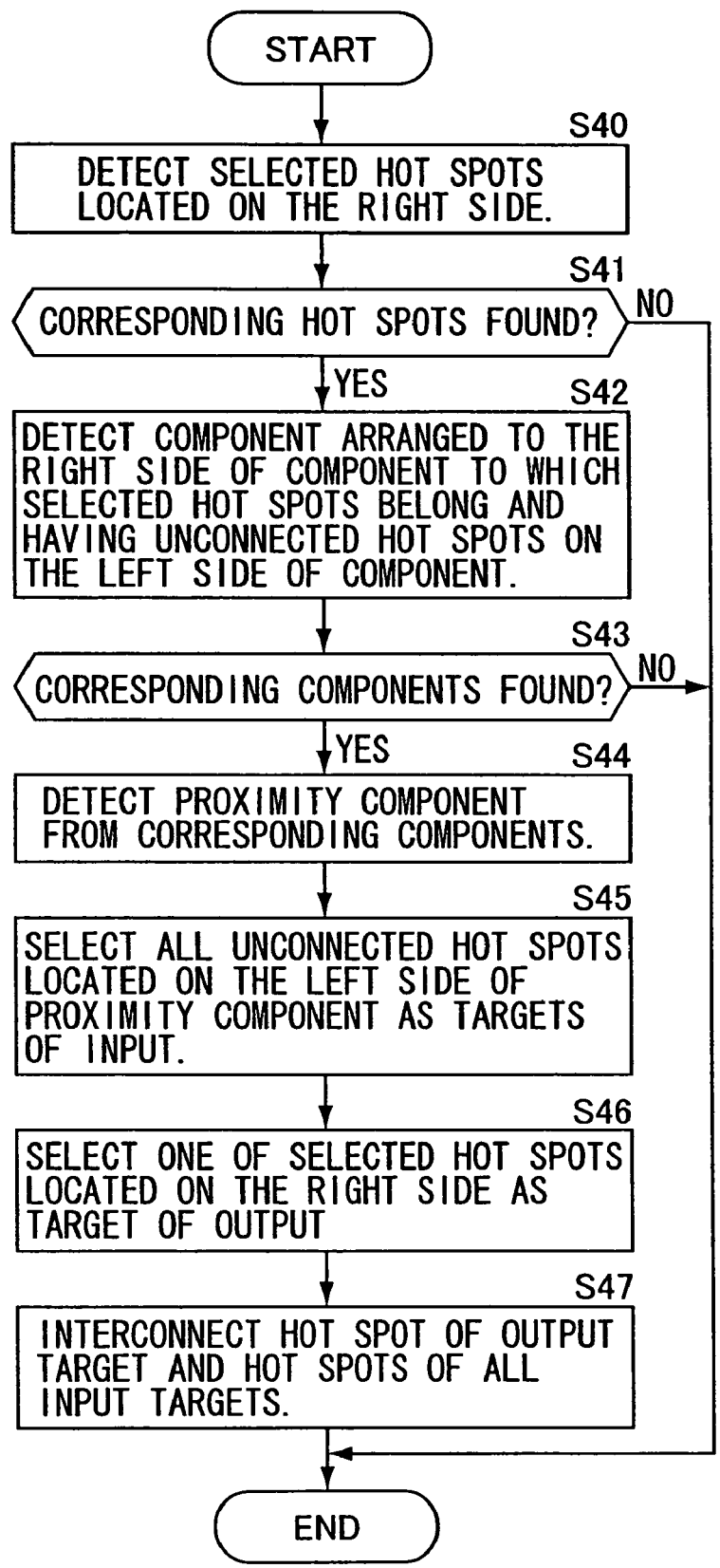

SIGNAL ROUTING APPARATUS AND SIGNAL ROUTING PROGRAM

BACKGROUND OF THE INVENTION

1. Technical Field

The present invention relates to a signal routing apparatus and a signal routing program that are adapted to set signal routes among a plurality of displayed components by interconnecting the same.

2. Related Art

Software programs are known in which a plurality of functional circuits are displayed in blocks on display means and these blocks are interconnected with lines, thereby setting logical signal communications routes between the functional circuits. This software is executed on computer to provide a signal routing apparatus. In this signal routing apparatus, one block (namely, one functional circuit) displayed on display means has a plurality of input terminals and output terminals and, by use of a cursor as a pointer, an input terminal and an output terminal to be interconnected are selected one by one to interconnect the selected input terminal and output terminal, thereby providing logical signal routing.

SUMMARY OF THE INVENTION

As describes above, the above-mentioned prior-art signal routing apparatus requires complicated and time-consuming work of interconnecting terminals by selecting the same one by one.

It is therefore an object of the present invention to provide a signal routing apparatus and a signal routing program that are capable of interconnecting terminals without the necessity for the above-mentioned complicated and time-consuming work.

In carrying out the invention and according to one aspect thereof, there is provided a signal routing apparatus for setting a signal route among a plurality of components of a signal processing system. The signal routing apparatus comprises a display part that displays a plurality of components each having at least one terminal for connection, an operator part that is operated to select at least one terminal of one component on the display part and to input an instruction for connection, a detection part that responds to the instruction for detecting at least one terminal of another component, which can be connectable to the selected terminal, and a connection part that connects the selected terminal of said one component and the detected terminal of said another component with one another so that a line is drawn on the display part between the selected terminal and the detected terminal, thereby setting the signal route among the components in the form of lines drawn between the terminals of the components on the display part.

Preferably, the detection part detects at least one terminal of another component which can be connectable to the selected terminal, such that the detected terminal is located on said another component which is arranged most closely to said one component on the display part.

Preferably, the operator part is operated to select one or more terminals of one component, the detection part detects one or more terminals of another component, which can be connectable to the selected terminals in one to one correspondence, and the connection part connects each of the selected terminals of said one component and each of the detected terminals of said another component by drawing each line between a corresponding pair of each selected terminal and each detected terminal.

Preferably, the display part displays the plurality of the components having two types of the terminals as input side and output side, the operator part inputs the instruction to specify one of the two types and thus selects the terminal of the one type specified by the instruction, the detection part detects the terminal of the other type according to the instruction as being connectable to the selected terminal, and the connection part connects the selected terminal of the one type and the detected terminal of the other type with each other so that the signal route is set between the terminals of the input side and the terminals of the output side.

Preferably, the operator part comprises a keyboard having a plurality of keys such that a set of specific keys are operated in combination to input the instruction for connection. In such a case, the set of the specific keys is a combination of a function key and one of numeric keys, so that the function key is operated to enable inputting of the instruction and different numeric keys are selectively operated to specify detail of the instruction for connection.

In another aspect of the invention, there is provided a signal routing apparatus for setting a signal route among a plurality of components of a signal processing system. The inventive signal routing apparatus comprises a display part that displays a plurality of components each having at least one terminal for connection, an operator part that is operated to select one component on the display part and to input an instruction for specifying a mode of connection, a detection part that responds to the instruction for detecting another component which can be connectable to the selected component, and a connection part that connects at least one terminal contained in the selected component and at least one terminal contained in the detected component with each other according to the instruction so that a line is drawn on the display part between the terminal of the selected component and the terminal of the detected component, thereby setting the signal route among the components in the form of lines drawn between the terminals of the components on the display part.

Preferably, the detection part detects another component which is arranged most closely to the selected one component on the display part as being connectable to the selected component.

Preferably, the connection part connects one or more of terminals contained in the selected component and one or more of terminals contained in the detected component with each other according to the instruction so that each line is drawn on the display part between each terminal of the selected component and each terminal of the detected component in one to one correspondence.

Preferably, the display part displays a plurality of components having two types of the terminals as input side and output side, the operator part inputs the instruction to specify one of the two types, and the connection part connects the terminal of the one type contained in the selected component and the terminal of the other type contained in the detected component according to the instruction so that the signal route is set between the terminals of the input side and the terminals of the output side.

In a further aspect of the invention, there is provided a signal routing apparatus for setting a signal route among a plurality of components of a signal processing system. The inventive signal routing apparatus comprises a display part that displays a plurality of components each having at least one terminal for connection, an operator part that is operated to select at least one terminal of one component on the display part and to input an instruction for connection, a detection part that responds to the instruction for detecting a multiple of terminals of another component, which can be connectable to the selected one terminal, and a connection part that connects the selected one terminal of said one component and the multiple of the detected terminals of said another component with one another so that a multiple of liens are drawn on the display part from the selected one terminal to the multiple of the detected terminals, thereby setting the signal route among the components in the form of lines drawn between the terminals of the components on the display part.

According to the present invention, when an instruction for connecting a selected terminal in one component comes, a corresponding terminal of another component that is connectable to the selected terminal specified for connection is detected automatically according to the instruction, and this detected terminal is connected to the selected terminal specified for connection, thus providing optimum connection by selecting only one of the two terminals to be interconnected with one another. In addition, a plurality of connections may be executed at the same time with a single instruction, thus easily speeding up work of the interconnection of components of any signal processing system.

BRIEF DESCRIPTION OF THE DRAWINGS

FIG. 3 is a diagram illustrating an initial screen of a signal route setting screen that is presented on a display device when one DSP (mixer engine) is selected in the signal routing apparatus according to the invention.

FIG. 4 is a diagram illustrating an exemplary data structure of component attribute information used in the signal routing apparatus according to the invention.

FIG. 19 is a flowchart indicative of special connection processing executed by the computer (PC) on which the signal routing program according to the invention is installed.

DETAILED DESCRIPTION OF THE INVENTION

Figure 1:
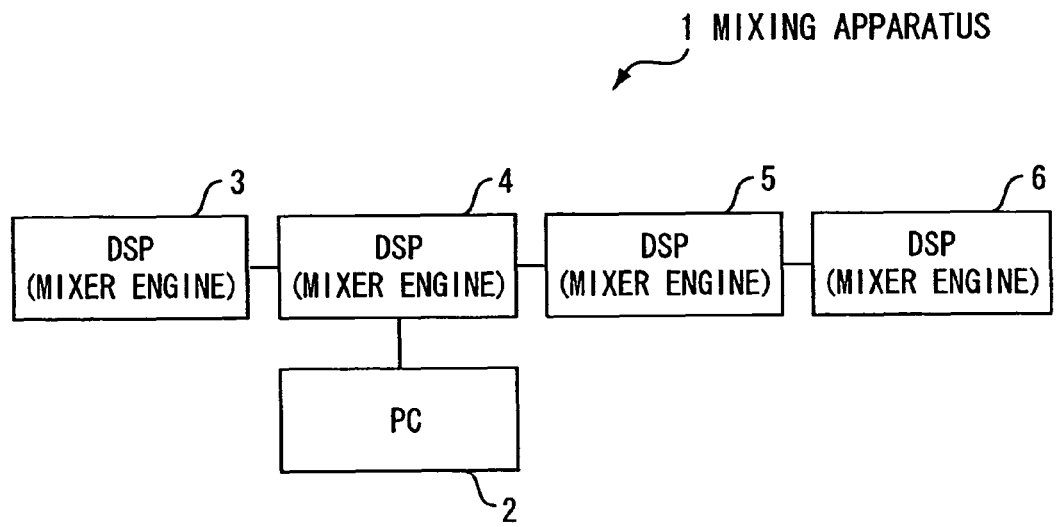
FIG. 1 is a block diagram illustrating a configuration of a mixing system which is adapted to execute predetermined mixing processing on audio signals, and which is set with signal routing by executing graphic connection work with a signal routing apparatus according to the invention.

Now, referring to FIG. 1, there is shown a configuration of a mixing system for executing predetermined mixing processing on audio signals through signal routes which are set as a result of the connection done by the signal routing apparatus according to the invention.

In a mixing system 1 shown in FIG. 1, a computer (PC) 2 provides the signal routing apparatus according to the invention on which a signal routine program according to the invention is installed. Execution of the signal routing program according to the invention by the computer (PC) 2 allows, in a desired manner, the signal routing among components that are functional circuits in mixer engines DSP 3, DSP 4, DSP 5, and DSP 6. The DSPs (mixer engines) 3 through 6 constitute the mixing system 1, and are substantially the same in configuration and physically cascaded in connection. Each DSP (mixer engine) is capable of executing mixing processing of the audio signals for a predetermined number of channels. Namely, as the number of cascaded DSPs (mixer engines) increases, the number of channels to be mixed by the mixing system 1 increases thereby providing functional expansion of the system. A plurality of components that are functional circuits of the mixing system are arranged by the DSPS (mixer engines) 3 through 6. These components may include a volume control component, an equalizer component, an effector component, and so on, by combinations of which each DSP comes to function as a mixer engine that carries out predetermined mixing processing.

Figure 2:
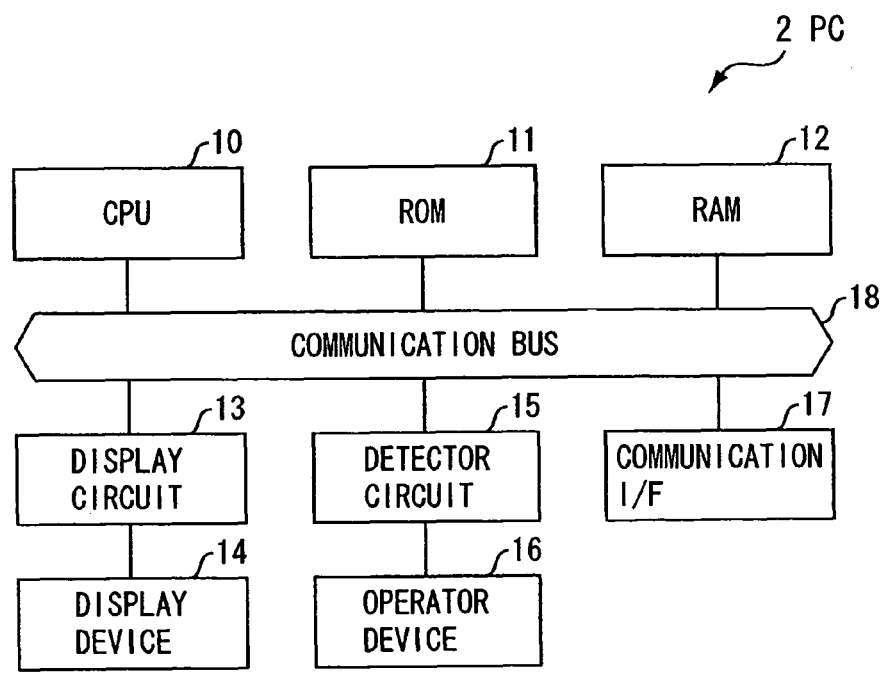
FIG. 2 is a block diagram illustrating a configuration of a computer (PC) that provides the signal routing apparatus according to the invention on which a signal routing program according to the invention is installed.

Referring to FIG. 2, there is shown a configuration of the computer (PC) 2 that provides the signal routing apparatus according to the invention.

As shown in FIG. 2, the computer (PC) 2 has a CPU (Central Processing Unit) 10 for controlling the computer (PC) 2 in its entirety and executes the signal routing among the DSPs 3 through 6 by executing a connection manager program, a ROM (Read Only Memory) 11 storing operation software such as the signal routing program for example which is executed by the CPU 10, and a RAM (Random Access Memory) 12 functioning as a work area for the CPU 10 and storing various kinds of data. A display circuit 13 drives a display device 14 such as LCD for example, on which components of the DSPs (mixer engines) 3 through 6 are presented. An operator device 16 may include a keyboard and pointing device such as a mouse tool for selecting components and "hot spots" that graphically depict terminals provided each component for connection. The component is depicted in the form of a block and its terminals are depicted as hot spots on the display device 14. A detector circuit 15 scans the operator device 16 such as a pointing device for an input event and outputs the detected event corresponding to the operation done one the operator device 16. A communication interface (I/F) 17 provides interface for connecting the computer (PC) 2 to a communication network and connects the computer (PC) 2 to the cascaded DSPs (mixer engines) via this communication network. The parts of the computer (PC) 2 are interconnected via a communication bus 18.

In the signal routing that is executed by the computer (PC) 2, the DSPs (mixer engines) 3 through 6 are selected one by one and a setting screen for setting a signal route among components of the selected DSP (mixer engine) is presented on the display device 14. Now, referring to FIG. 3, there is shown an initial screen of a setting screen 20 that is presented on the display device 14 when the DSP (mixer engine) 3 for example has been selected by starting up a signal routing program in the computer (PC) 2. As shown, the setting screen 20 is composed of a connection display section 20a and a list display section 20b. The connection display section 20a shows components to be interconnected when inter-component connection process is executed, showing an input component IN on the left and an output component OUT on the right as the initial screen. The input component IN is equivalent to an input terminal device in which a signal to be mixed in the DSP (mixer engine) 3 is inputted. In an example shown, the input component IN has 8 hot spots #1 through #8 that function as 8-channel input terminals. The output component OUT is equivalent to an output terminal device from which a signal to be mixed in the DSP (mixer engine) 3 is outputted. In an example shown, the output component OUT has 4 hot spots #1 through #4 that function as 4-channel output terminals.

The list display section 20b shows two or more kinds of components having the number of input hot spots, the number of output hot spots, and having different functions prepared for the DSP (mixer engine) 3. A desired one of these components is dragged with the pointing tool of the operator device 16 to a predetermined position between the input component IN and the output component OUT and dropped there, hence the function provided by this dropped component becomes available in the DSP (mixer engine) 3 by this graphic operation. Thus, dragging and dropping two or more components having necessary functions at predetermined positions between the input component IN and the output component OUT and setting signal routes among these components allow the DSP (mixer engine) 3 to effect a desired mixing performance. Each of these components has a predetermined number of input hot spots and a predetermined number of output hot spots. An input hot spot of the intermediate component arranged between the input component IN and the output component OUT may be connected to hot spot #1 of the input component IN for example so that an input signal at input channel #1 enter the intermediate component arranged between the input component In and the output component OUT. An output hot spot of this intermediate component may be connected to hot spot #1 of the output component OUT for example, so that the intermediate component outputs an output signal to the output channel #1.

Information about the connection described above is stored, as component attribute information, in a current buffer allocated in the RAM 12. FIG. 4 shows one example of a data structure of this component attribute information. The component attribute information is indicative of component identifier, component function, and hot spot connection information. The attribute information of all components that are used (namely, arranged by drag and drop operations) in the DSP (mixer engine) are stored in the current buffer. The attribute information of the components in each DSP (mixer engine) is configured as shown in FIG. 4. If attention is paid to a first component for example, the attribute information thereof is composed of identification information (ID1) unique to the first component, the reference coordinate central to a position at which the first component is arranged to the setting screen 20, connection information (IN11 through IN1$x$) indicative of correspondence between output hot spots of an adjacent component and input hot spots of the first component, which are connected with each other, and connection information indicative of correspondence between input spots of an adjacent block and output hot spots of the first component, which are connected with each other. The same holds with the attribute information of the second and subsequent components.

Figure 5:
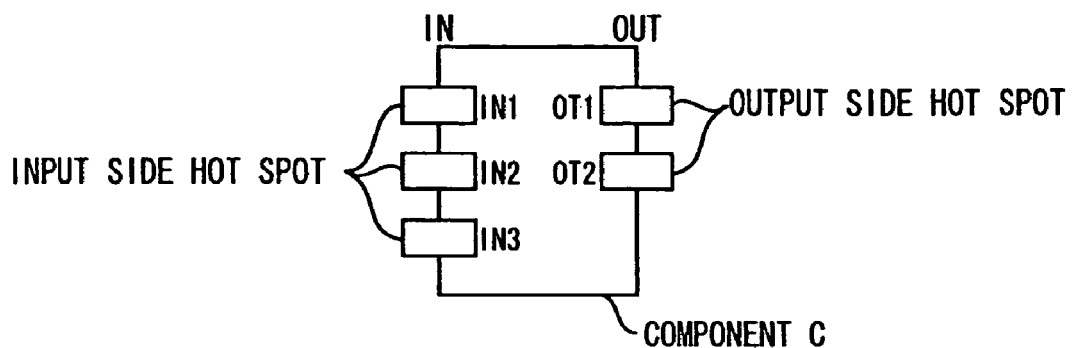
FIG. 5 is a diagram illustrating an exemplary configuration of a component treated in the signal routing apparatus according to the invention.

Referring to FIG. 5, there is shown an exemplary configuration of a typical component. Component C shown may be one of volume control component, equalizer component, effector component and so on, and has 3 input hot spots IN and 2 output hot spots OUT. Namely, the component C is capable of receiving 3 input signals and feeding 2 output signals that are a result of the processing executed on these 3 input signals by the function of component C. In this example, the input hot spots are arranged to the left side and the output hot spots are arranged to the right side, regardless of component type.

The following describes an operation of the signal routing apparatus according to the invention by use of the connection processing executed between components by the computer (PC) 2 as an example.

Figure 6:
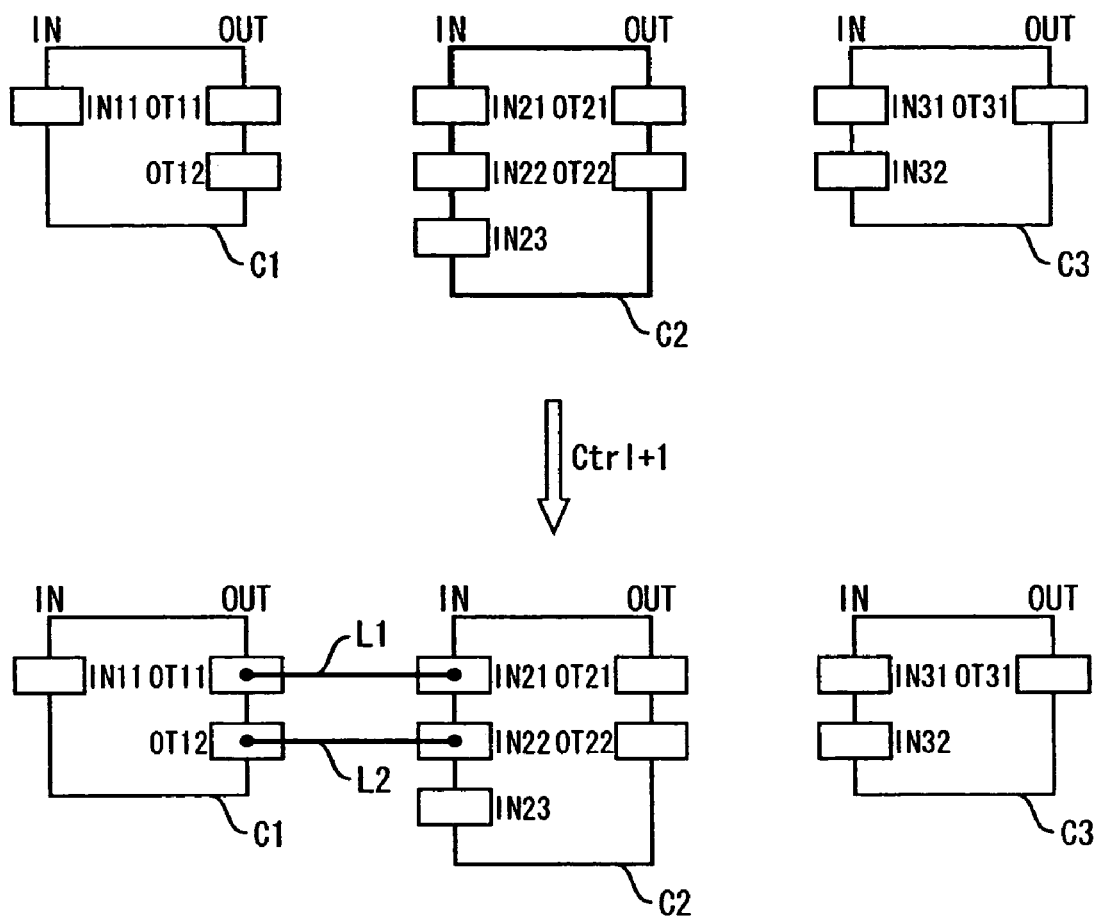
FIG. 6 is a diagram illustrating an exemplary display screen presented on a display device for executing connection processing in the signal routing apparatus according to the invention.

Referring to FIG. 6, there is shown one example of a display screen of the connection display section 20a, on which a first component C1, a second component C2, and a third component C3 are arranged from left to right in this order. When connection processing is executed by the signal routine apparatus, input hot spots of a selected component are connected to output hot spots of another component arranged to the left side of the input hot spots of the selected component, or output hot spots of the selected component are connected to input hot spots of another component arranged to the right side of the output hot spots of the selected component. In this example, the first component C1 has 1 input hot spot IN11 and 2 output hot spots OT11 and OT12, the second component C2 has 3 input hot spots IN21, IN22, and IN23 and 2 output hot spots OT21 and OT22, and the third component C3 has 2 input hot spots IN31 and IN32, and 1 output hot spot OT31.

In the connection processing associated with a first embodiment of the invention that is executed in the signal routing apparatus, a component to be connected is selected for the connection processing. Therefore, it is assumed that a cursor of the pointing tool be positioned at the second component C2 and clicked for the selection of the second component C2. Then, as shown in the upper half of FIG. 6, the selected second component C2 is displayed in a thick frame. Next, simultaneously pressing the control key (Ctrl) which is one of function keys and the "1" key which is one of numeric keys enables inputting of instruction for connection. In response to the instruction, the signal routing apparatus detects a proximity component arranged to the left side of the second component C2 and having unconnected output hot spots that are connectable to input hot spots of the second component C2. Namely, when the control key (Ctrl) and the "1" key of the keyboard are pressed at the same time, the connection source for the connection processing is restricted to the input hot spots of the selected component. In the detection processing, the first component C1 is detected as a proximity component having unconnected output hot spots that are the destination of connection. It should be noted that the detection of the proximity component is executed by computing a distance between two components based on the reference coordinates contained in the component attribute information. Next, so as to connect output hot spots of the detected first component C1 to input hot spots of the second component C2, the output hot spot OT11 having the lowest number among the unconnected output hot spots shown on the right side on the detected first component C1 is subjected to the connection processing and at the same time, the input hot spot IN21 having the lowest number among the unconnected input hot spots on the left side on the selected second component C2 is subjected to the connection processing, thereby both of the target hot spots being interconnected with line L1. The connection of line L1 lets a signal outputted from the output hot spot OT11 be transmitted to the input hot spot IN21.

Further, the processing of detecting any unconnected output hot spot on the right side of the detected first component C1 is executed. This time, the output hot spot having the lowest number among the unconnected output hot spots on the right side on the detected first component C1 becomes OT12 to be a target and, at the same time, the input hot spot having the lowest number among the unconnected input hot spots on the left side on the selected second component C2 becomes IN22 to be target, thereby both of the two target hot spots being interconnected with line L2. Consequently, the output hot spot OT11 is connected with the input hot spot IN21 with line L1, and the output hot spot OT12 is connected with the input hot spot IN22 with line L2 in the connection display section 20a as shown in the lower portion of FIG. 6. Such automatic signal routing process is performed on the display screen by means of the user graphic interface provided by the inventive signal routing program. At the same time, the attribute information of the first component C1 and the second component C2 is rewritten by the information that reflects the connection carried out by the above-mentioned connection processing. It should be noted that, as long as there is a pair of an unconnected output hot spot and an unconnected input hot spot that are subject to processing, the connection processing is repeated. In the example shown in FIG. 6, the number of output hot spots of the first component C1 is 2, OT11 and OT12, so that, when the output hot spot OT12 has been connected, the connection processing ends. When the connection processing has ended, a display screen on which the deselected state of the second component C2 is shown is presented on the connection display section 20a as shown in the lower half of FIG. 6.

Figure 7:
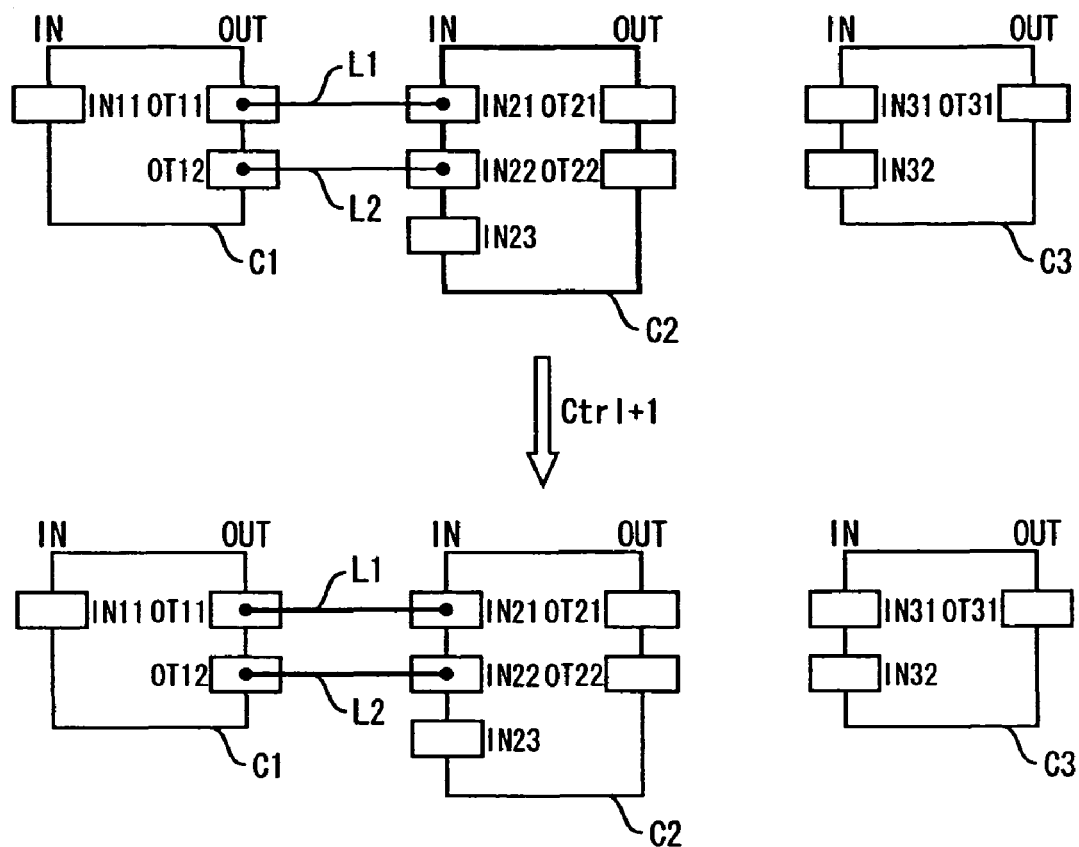
FIG. 7 is a diagram illustrating another exemplary display screen presented on a display device for executing connection processing in the signal routing apparatus according to the invention.

In the example shown in FIG. 6, there is no hot spot already connected. FIG. 7 shows an example in which there are hot spots already connected. On the display screen of the connection display section 20a shown in FIG. 7, the output hot spot OT11 of the first component C1 is connected with the input hot spot IN21 of the second component C2 with line L and, at the same time, the output hot spot OT12 of the first component C1 is connected with the input hot spot IN22 of the second component C2 with line L2. In this case, assume that the second component C2 be selected and the control key (Ctrl) and the "1" key be pressed at the same time. When the control key (Ctrl) and the "1" key are pressed at the same time, the target of the connection source to be connected is restricted to the input hot spots of the selected component. Then, the proximity component, arranged to the left side of the second component C2, having unconnected output hot spots connectable to input spots of the second component is detected. In this case, however, because 2 output hot spots OT11 and OT12 of the first component C1 arranged to the left side of the second component are both connected, the component of the connection destination is not detected. Namely, because the component that is the destination of connection is not detected, the connection processing ends without executing connection. When the connection processing has ended, a display screen on which the deselected state of the selected second component C2 is shown is presented on the connection display section 20a as shown in the lower section of FIG. 7.

Figure 8:
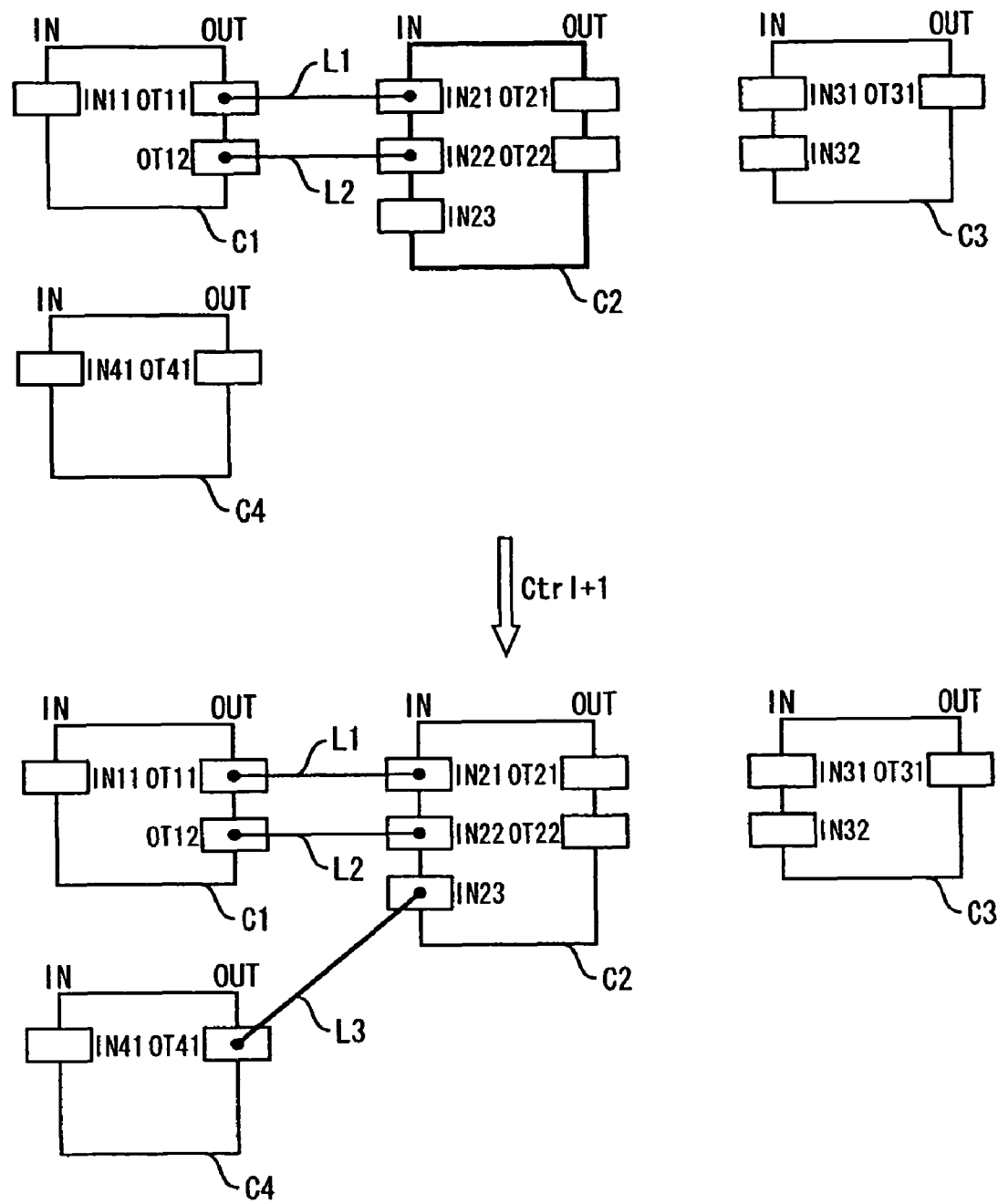
FIG. 8 is a diagram illustrating still another exemplary display screen presented on a display device for executing connection processing in the signal routing apparatus according to the invention.

Next, referring to FIG. 8, there is shown a display screen on which a fourth component C4 is added by dragging and dropping from the list display section 20b to the connection display section 20a. The following describes the connection processing in which the fourth component C4 has been added to the left side of the second component C2 with reference to FIG. 8. In this case, as shown on the connection display section 20a of FIG. 8, the output hot spot OT of the first component C1 is already connected to the input hot spot IN21 of the first component with line L1 and, at the same time, the output hot spot OT12 of the first component is already connected to the input hot spot IN22 of the second component with line 2. Assume that the second component C2 be selected and the control key (Ctrl) and the key "1" be pressed at the same time. When the control key (Ctrl) and the key "1" are simultaneously pressed, the target of the connection source to be connected is restricted to input hot spots of the selected component. Then, the proximity component arranged to the left side of the second component and having unconnected output hot spots that are connectable to input hot spots of the second components is detected as the component of the destination of connection. In this case, because the proximity first component C1 has no unconnected output hot spots, the fourth component C4, another component located on the left side of the proximity first component C1, arranged in the proximity of the second component C2 next to the first component C1, having unconnected output hot spots, is detected as the component as the destination of connection.

Next, so as to connect an output hot spot of the detected fourth component C4 with an input hot spot of the detected second component C2, the output hot spot OT41 having the lowest number among the unconnected output hot spots on the right side on the detected fourth component C4 is subjected to processing and, at the same time, the input hot spot IN23 having the lowest number among the unconnected input hot spots on the left side on the selected second component C2 is subjected to processing, both target hot spots being interconnected with line L3. Further, an unconnected output hot spot on the right side on the detected fourth component C4 is detected. In this case, however, there is no unconnected output hot spot, so that the connection processing ends without executing the subsequent connection processing. When the connection processing has ended, a display screen on which the deselected state of the selected second component C2 is shown is presented on the connection display section 20a as shown in the lower section of FIG. 8. In addition, the attribute information of the fourth components C4 and the second component C2 is rewritten to the information that reflects the connection resulted from the above-mentioned connection processing.

Figure 9:
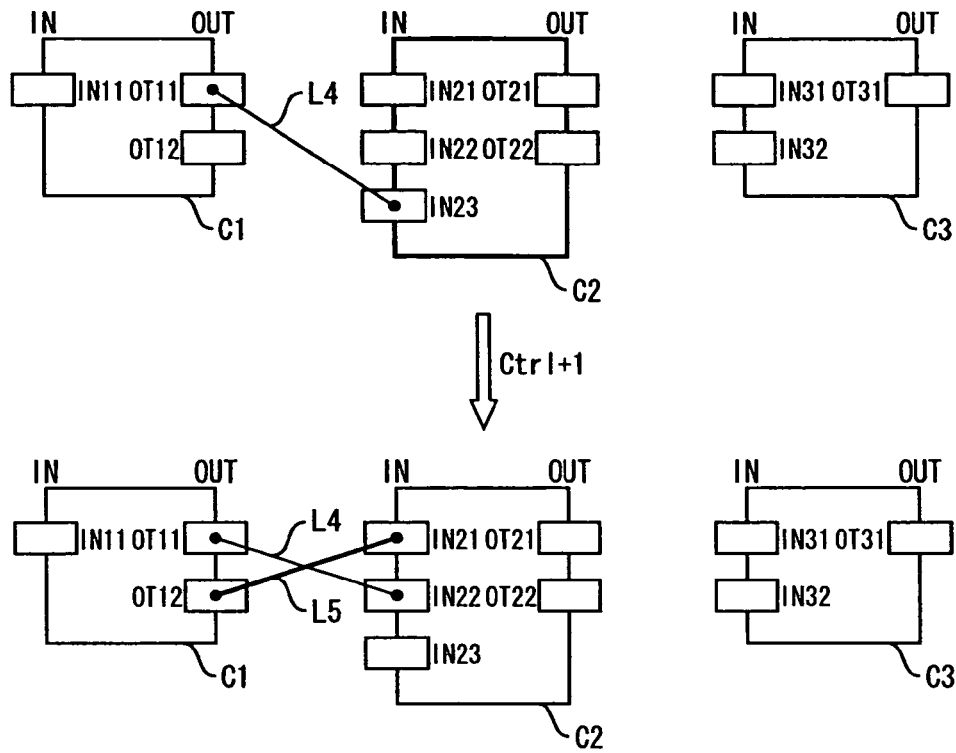
FIG. 9 is a diagram illustrating yet another exemplary display screen presented on a display device for executing connection processing in the signal routing apparatus according to the invention.

Referring to FIG. 9, there is shown an example of a display screen on which output hot spots of given numbers are already connected to input hot spots of given numbers. In the connection display section 20a shown in FIG. 9, the output hot spot OT11 of the first component C1 is already connected to the input hot spot of IN23 of the second component with line 4. Assume here that the second component C2 be selected and the control key (Ctrl) and the "1" key be pressed at the same time. when the control key (Ctrl) and the "1" key are pressed at the same time, the target of the connection source to be connected is restricted to input hot spots of the selected component. Then, the proximity component arranged to the left side of the second component C2 and having unconnected output hot spots that are connectable to input hot spots of the second component C2 is detected as the component as the destination of connection. In this case, the first component C1 is detected as the component of the destination of connection. Next, so as to connect an output hot spot of the detected first component C1 with an input hot spot of the detected second component C2, the output hot spot OT12 having the lowest number among the unconnected output hot spots on the right side on the detected first component C1 is subjected to processing and, at the same time, the input hot spot IN21 having the lowest number among the unconnected input hot spots on the left side on the selected second component C2 is subjected to processing, both target hot spots being interconnected with line L5. Further, an unconnected output hot spot on the right side of the detected first component C1 is detected. In this case, however, there is no unconnected output hot spot, so that the connection processing ends without executing the subsequent connection processing. When the connection processing has ended, a display screen on which the deselected state of the selected second component C2 is shown is presented on the connection display section 20a as shown in the lower section of FIG. 9. In addition, the attribute information of the first components C1 and the second component C2 is rewritten to the information that reflects the connection resulted from the above-mentioned connection processing.

Figure 10:
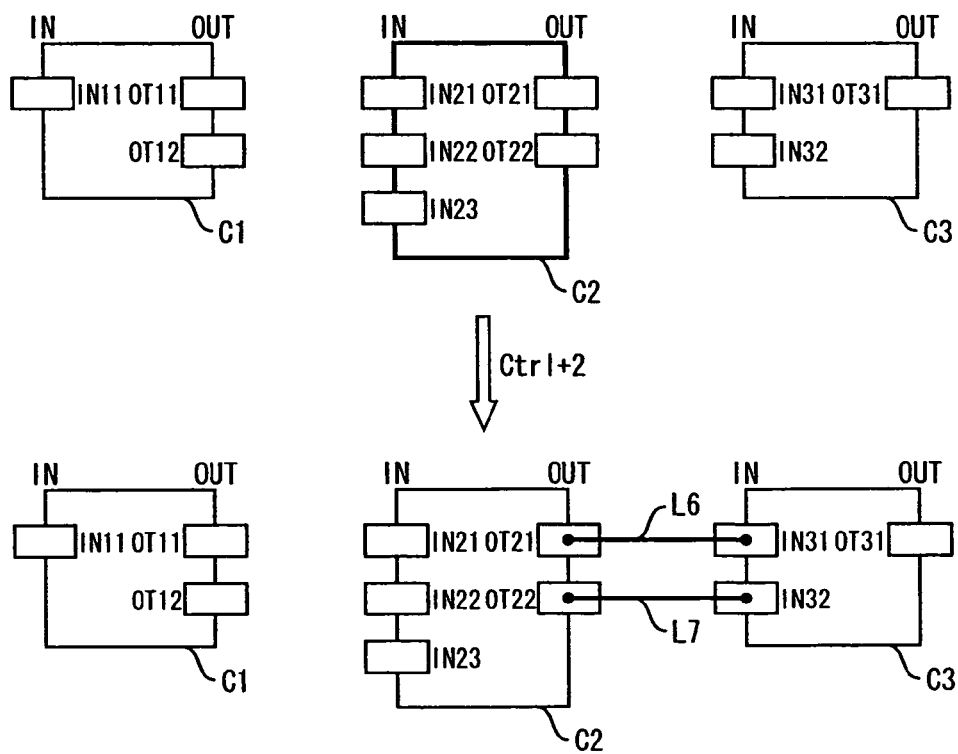
FIG. 10 is a diagram illustrating a different exemplary display screen presented on a display device for executing connection processing in the signal routing apparatus according to the invention.

The following describes connection processing for connecting an output hot spot on the right side of a selected component to an input hot spot of a component arranged to the right side of the selected component with reference to the connection display section 20a shown in FIG. 10.

As shown in FIG. 10, assume here that the second component C2 be selected and the control key (Ctrl) and the "1" key be pressed at the same time. when the control key (Ctrl) and the "1" key are pressed at the same time, the target of the connection source to be connected is restricted to output hot spots of the selected component. Then, the proximity component arranged to the right side of the second component C2 and having unconnected input hot spots that are connectable to output hot spots of the second component C2 is detected as the component as the destination of connection. In this detection processing, the third component C3 is detected as the component of the destination of connection. Next, so as to connect an input hot spot of the detected third component C3 with an output hot spot of the detected second component C2, the input hot spot IN31 having the lowest number among the unconnected input hot spots on the left side on the detected third component C3 is subjected to processing and, at the same time, the output hot spot OT21 having the lowest number among the unconnected output hot spots on the right side on the selected second component C2 is subjected to processing, both target hot spots being interconnected with line L6.

Further, an unconnected input hot spot on the left of the detected third component C3 is detected. This time, the input hot spot having the lowest number among the unconnected input hot spots on the left side on the detected third component C3 becomes IN32 to be subjected to processing and, at the same time, the output hot spot having the lowest number among the unconnected output hot spots on the right side on the selected second component C2 becomes OT22 to be subjected to processing, both target hot spots being interconnected with line L7. Consequently, a display screen on which the input hot spot IN31 is connected to the output hot spot OT21 and the input hot spot IN32 is connected to the output hot spot OT22 is shown in the connection display section 20a as shown in the lower half of FIG. 10. In addition, the attribute information of the third component C3 and the second component C2 is rewritten to the information that reflects the connection resulted from the above-mentioned connection processing. It should be noted that, as long as there is a pair of an unconnected output hot spot and an unconnected input hot spot that are subject to processing, the connection processing is repeated. In the example shown in FIG. 10, however, the third component C3 has 2 input spots, IN31 and IN32, so that, when the input hot spot IN32 has been connected, the connection processing ends. When the connection processing has ended, a display screen on which the deselected state of the selected second component C2 is shown is presented on the connection display section 20a as shown in the lower half of FIG. 10.

Figure 11:
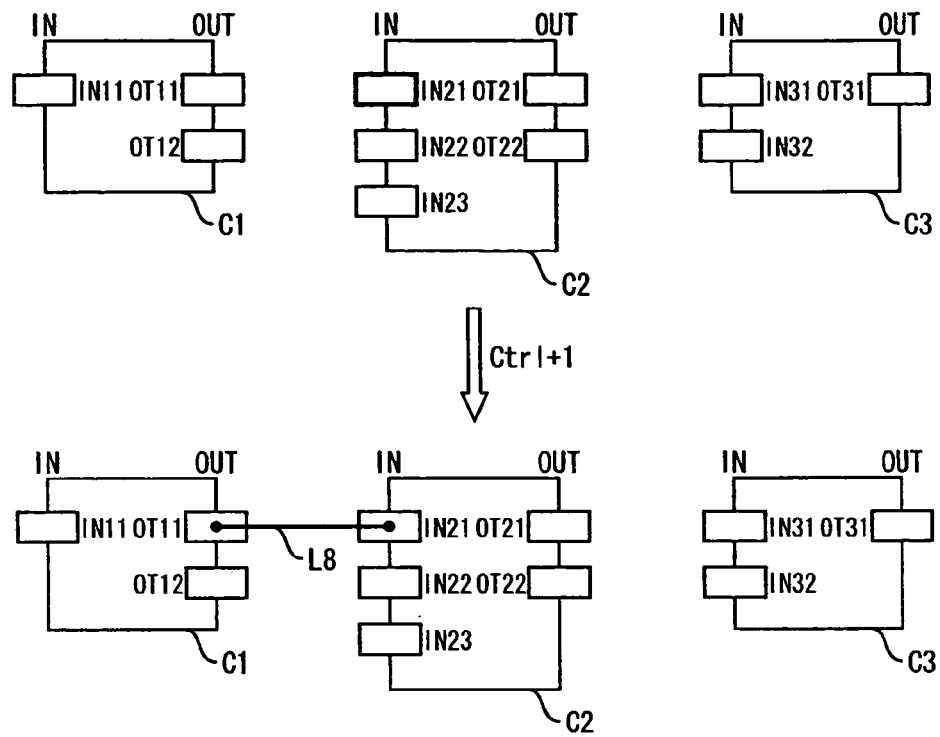
FIG. 11 is a diagram illustrating a still different exemplary display screen presented on a display device for executing connection processing in the signal routing apparatus according to the invention.

In the connection processing according to a second embodiment of the invention, a hot spot to be connected is selected for connection processing. Now, assume that the cursor of the mouse pointing tool be positioned to the input hot spot IN21 on the left side of the second component C2 in the connection display section 20a shown in FIG. 11. The mouse pointing tool be clicked to select the input hot spot IN21 as shown in the upper half of FIG. 11. Then, as shown in the upper half of FIG. 11, the selected input hot spot IN21 of the second component is displayed in thick frame. Next, when the control key (Ctrl) and the "1" key are pressed at the same time to input instruction for connection. The signal routing apparatus responds to the inputted instruction for detecting the proximity component which is most closely arranged to the left side of the second component C2 and which has an unconnected output hot spot that is connectable to the input hot spot IN21 of the second component C2. In this case, when the control key (Ctrl) and the numeric "1" key are pressed at the same time, the target of the connection source side is restricted to input hot spots of the selected component. In this detection processing, the first component C1 is detected as the component that is the destination of connection. The detection of the proximity component is executed by computing a distance between two components from a reference coordinate contained in the component attribute information. Next, so as to connect an output hot spot of the detected first component C1 with the input hot spot IN21 of the selected second component C2, the output hot spot OT11 having the lowest number among the unconnected output hot spots on the right side of the detected first component C1 is subjected to the processing target and at the same time, the input hot spot IN21 having the lowest number among the unconnected input hot spots of the selected second component C2 is subjected to the processing target, thereby both target hot spots being interconnected with line L8.

In this case, as long as there is an unconnected hot spot to be paired with a selected unconnected hot spot, the connection processing is executed; however, there is only one selected hot spot, the input hot spot IN21 of the second component, there is no more unconnected hot spot. Consequently, the connection processing ends, upon which a display screen on which the output hot spot OT11 is connected to the input hot spot IN21 with line L8 is presented on the connection display section 20*a* as shown in the lower half of FIG. 11. The attribute information of the first component C1 and the second component C2 is rewritten to the updated information that reflects the connection resulted from the above-mentioned connection processing. When the connection processing has ended, a display screen on which the deselected state of the input hot spot IN21 in the selected second component C2 is shown is presented on the connection display section 20*a* as shown in the lower half of FIG. 11.

Figure 12:
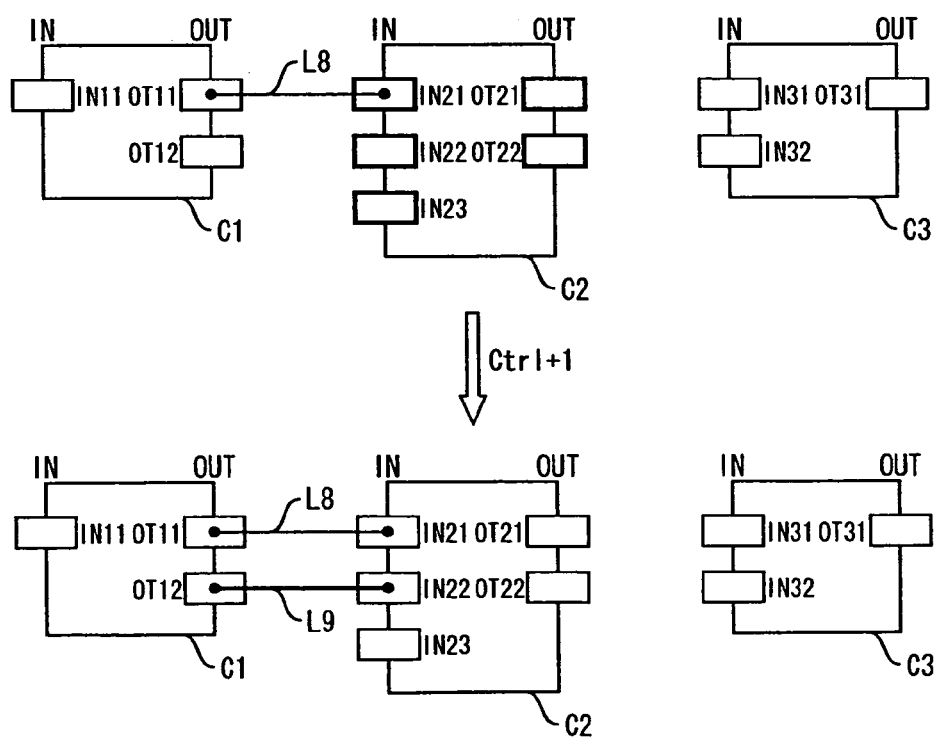
FIG. 12 is a diagram illustrating a yet different exemplary display screen presented on a display device for executing connection processing in the signal routing apparatus according to the invention.

Referring to FIG. 12, there is shown the connection display section 20*a* that is shown when a plurality of hot spots of a component to be connected are selected for connection processing. In this case, assume that the input hot spots IN21, IN22, and IN23 on the left side on the second component C2 and the output hot spots OT21 and OT22 on the right side thereon be selected. Then, as shown in the upper half of FIG. 12, the input hot spots IN21, IN22, and IN23 and the output hot spots OT21 and OT22 of the second component C2 are shown each in a thick frame. The input hot spot IN21 of the second component C2 is already connected to the output hot spot OT11 of the first component C1. When the control key (Ctrl) key and the "1" key are pressed at the same time, an unconnected input hot spot among the selected hot spots of the second component C2, arranged to the left side thereon is detected. When the control key (Ctrl) and the "1" key are pressed at the same time, the target of the connection source for connection processing is restricted to the input hot spots. In this example, because the input hot spot IN21 of the second component C2 is already connected, the input hot spot having the lowest number among unconnected input hot spots is detected as the hot spot to be subjected to the connection from the source of connection. Next, the proximity component having an unconnected output hot spot that is connectable to the detected input hot spot IN22 of the second component C2 is detected. In this detection processing, the first component C1 is detected as the component that is the destination of connection. The proximity component is detected by computing a distance between the 2 components from the reference coordinate contained in the component attribute information.

Next, so as to connect the detected output hot spot of the first component C1 to the selected input hot spot IN22 of he second component C2, the output hot spot OT12 having the lowest number among the unconnected output hot spots on the right side on the first component C1 is subjected to processing and, at the same time, the input hot spot IN22 of the second component C2 is subject to processing, both target hot spots being interconnected with line L9. This connection processing is repeated as long as there is any unconnected hot spot to be paired with the selected unconnected hot spot. However, because there is no more unconnected output hot spot on the selected first component C1, the connection processing ends. When the connection processing has ended, a display screen on which the output hot spot OT12 is newly connected to the input hot spot IN22 with line 9 is shown on the connection display section 20*a* in the lower half of FIG. 12. The attribute information of the first component C1 and the second component C2 is rewritten to the information that reflects the connection resulted from the above-mentioned connection processing. When the connection processing has ended, a display screen on which all selected hot spots of the selected second component C2 are deselected is shown on the connection display section 20*a* in the lower half of FIG. 12. It should be noted that, although the output hot spots of the second component C2 are selected as shown, the connection processing is not executed on these output hot spots because the target of the source of connection is restricted only to the input hot spots by pressing the control key (Ctrl) and the "1" key at the same time.

Figure 13:
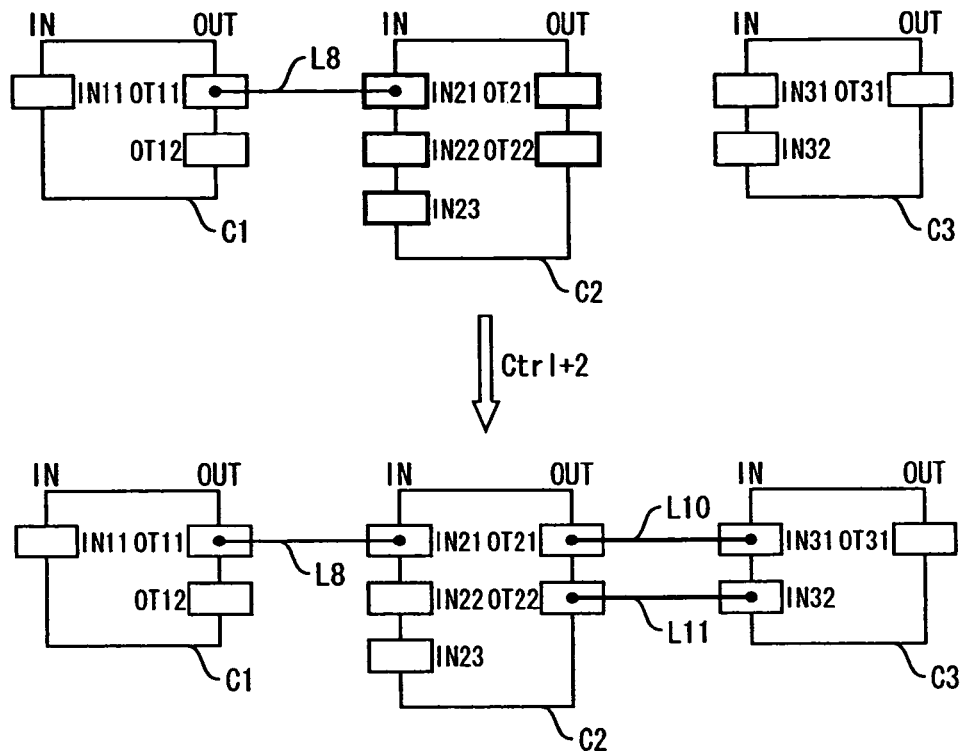
FIG. 13 is a diagram illustrating a separate exemplary display screen presented on a display device for executing connection processing in the signal routing apparatus according to the invention.

The following describes connection processing for connecting a selected output hot spot on the right side of a component to an input hot spot of a component arranged to the right side of the component having the selected output hot spot, with reference to the connection display section 20*a* shown in FIG. 13. In this example, as shown in FIG. 13, assume that the input hot spots IN21, IN22, and IN23 on the left side on the second component C2 and the output hot spots OT21 and OT22 be selected and the control key "Ctrl" and the "2" key be pressed at the same time. When the control key (Ctrl) and the "2" key are pressed at the same time, the target of the source of connection for connection processing is restricted to the output hot spots. Then, the proximity component arranged to the right side of the second component C2 and having an unconnected input hot spot connectable to an output hot spot of the second component C2 is detected. In this detection processing, the third component C3 is detected as the component of the destination of connection. Next, so as to connect an input hot spot of the detected third component C3 to a selected output hot spot of the second component C2, the input hot spot IN31 having the lowest number among the unconnected input hot spots on the left side on the detected third component C3 is subjected to processing and, at the same time, the output hot spot OT21 having the lowest number among the selected unconnected output hot spots on the right side on the second component C2 is subjected to processing, both target hot spots being interconnected with line L10.

Further, an unconnected input hot spot on the left side on the detected third component C3 is detected. This time, the input hot spot having the lowest number among the unconnected input hot spots on the left side of the detected third component C3 becomes IN32 to be subjected to processing and, at the same time, the output hot spot having the lowest number among the selected unconnected output hot spots on the right side on the selected second component C2 becomes OT22 to be subjected to processing, both target hot spots being interconnected with line L11. Consequently, a display screen on which the input hot spot IN31 is connected to the output hot spot OT21 and the input hot spot IN32 is connected to the output hot spot OT22 is shown in the connection display section 20*a* as shown in the lower half of FIG. 13. In addition, the attribute information of the third component C3 and the second component C2 is rewritten to the information that reflects the connection resulted from the above-mentioned connection processing. It should be noted that, as long as there is a pair of an unconnected output hot spot and an unconnected input hot spot that are subject to processing, the connection processing is repeated. In the example shown in FIG. 13, however, the third component C3 has 2 input spots, IN31 and IN32, so that, when the input hot spot IN32 has been connected, the connection processing ends. When the connection processing has ended, a display screen on which the deselected state of the selected second component C2 is shown is presented on the connection display section 20*a* as shown in the lower half of FIG. 13.

Figure 14:
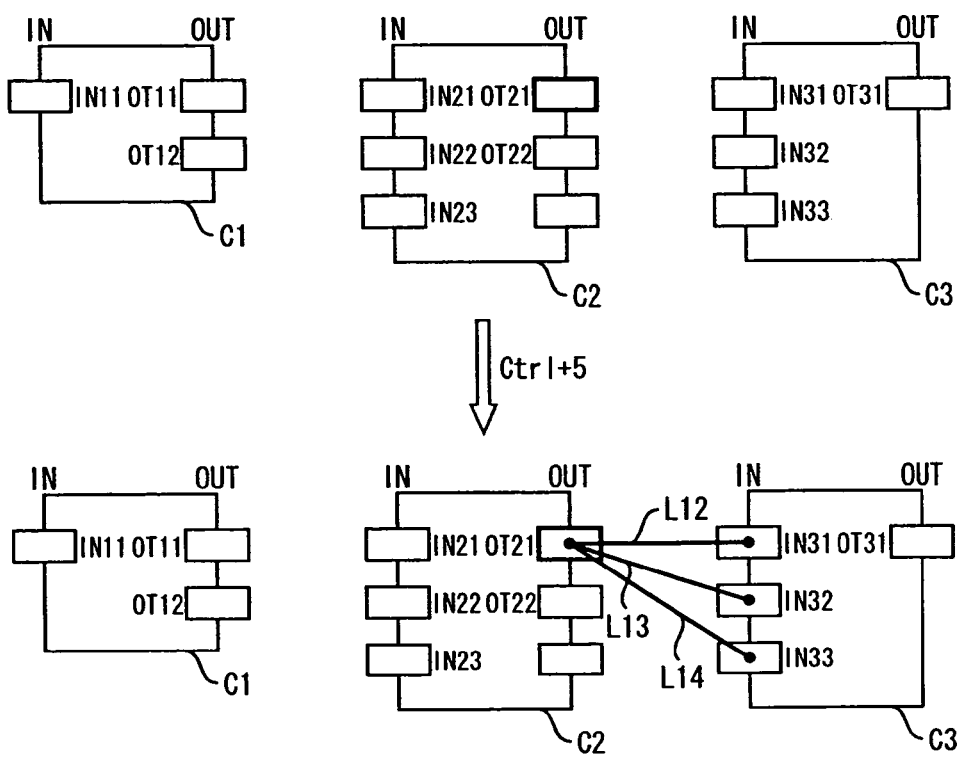
FIG. 14 is a diagram illustrating a still separate exemplary display screen presented on a display device for executing connection processing in the signal routing apparatus according to the invention.

In the connection processing according to a third embodiment of the invention, one of the output hot spots on the right side on a component to be connected is selected and the selected output hot spot is connected to a plurality of input hot spots of another component. Now, assume here that the cursor be positioned to the output hot spot OT21 on the right side on the second component in the connection display section 20a shown in FIG. 14 and the output hot spot OT21 be clicked to select the output hot spot OT21. Then, the output hot spot OT21 of the second component C2 is shown in thick frame as shown in the upper half of FIG. 14. When the control key (Ctrl) is the "5" key are pressed at the same time, the proximity component arranged to the right of the second component C2 and having an unconnected input hot spot connectable to the output hot spot OT21 of the second component C2 is detected. When the control key (Ctrl) and the "5" key are pressed at the same time, the target of the source of connection for connection processing is restricted to one of the output hot spots and, at the same time, all of the unconnected input hot spots of the detected component become the destination of connection. in this example, the third component C3 is detected as the component that is the destination of connection. The proximity component is detected by computing a distance between the 2 components from the reference coordinate contained in the component attribute information. Next, so as to connect all unconnected input hot spots of the detected third component C3 to the output hot spot OT21 of the selected second component C2, all unconnected input hot spots IN31, IN32, and IN33 on the left side on the detected third component are subject to processing and, at the same time, the output hot spot OT21 of the selected second component C2 is subjected to processing, the output hot spot OT21 being connected to the input hot spots IN31, IN32, and IN33 with lines L12, L13, and L14 respectively.

Consequently, the connection processing ends, upon which a display screen showing the connection of the output hot spot OT21 to the input hot spots IN31, IN32, and IN33 with lines L12, L13, and L14 respectively is shown on the connection display section 20a. The attribute information of the third component C3 and the second component C2 is rewritten to the information that reflects the connection resulted from the above-mentioned connection processing. It should be noted that, when the connection processing ends, the selected state of the output hot spot OT21 in the selected second component is not cleared.

Figure 15:
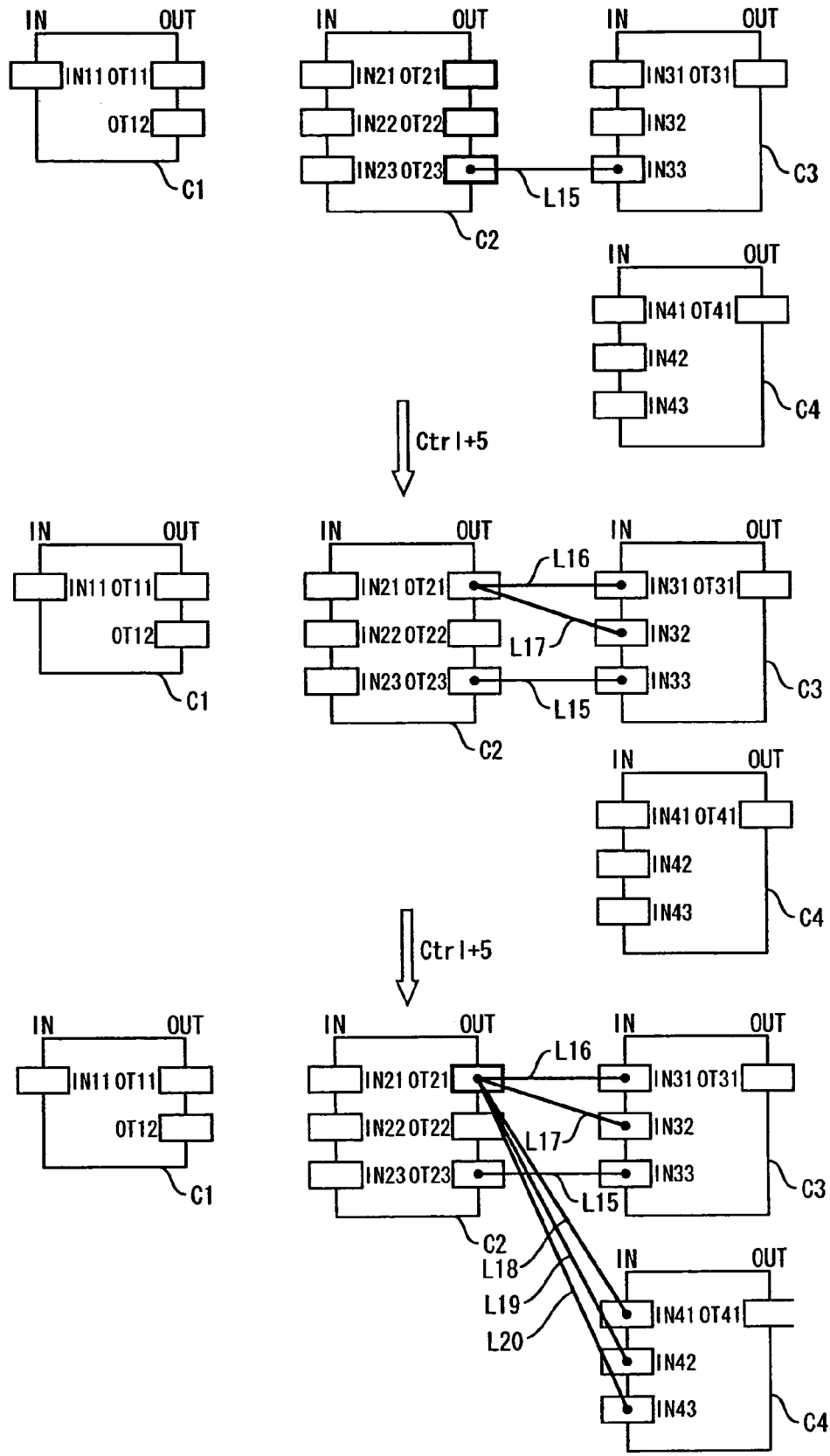
FIG. 15 is a diagram illustrating a yet separate exemplary display screen presented on a display device for executing connection processing in the signal routing apparatus according to the invention.

The following describes a variation to the connection processing of the third embodiment with reference to FIG. 15. With the connection display section 20a shown in FIG. 15, the first component C1 is arranged to the left side of the second component C2 and the third component C3 and the fourth component C4 are arranged to the right side of the second component C2. Output hot spots OT21, OT22, and OT23 on the right side on the second component are selected and shown in thick frames as shown in the upper portion of FIG. 15. Further, the output hot spot OT23 of the second component is already connected to the input hot spot IN33 of the third component with line 15. When the control key (Ctrl) and the "5" are pressed at the same time, the proximity component arranged to the right side of the second component C2 and having an unconnected output hot spot connectable to the output hot spot OT21 having the lowest number among the output hot spots selected by the second component is detected. when the control key (Ctrl) and the "5" key are pressed at the same time, the target of the source of connection for connection processing is restricted to one of the output hot spots and all unconnected input hot spots of the detected component become the destination of connection.

In this example, the third component C3 is detected as a component. The proximity component is detected by computing a distance between 2 components from the reference coordinate contained in the component attribute information. Next, so as to connect all unconnected input hot spots of the detected third component C3 to the output hot spot OT21 of the selected second component C2, all unconnected input spots IN31 and IN32 on the left side on the detected third component are subjected to processing and the already connected input hot spot IN33 is excluded from processing. Then, the output hot spot OT21 of the selected second component C2 is subjected to processing and all target hot spots are interconnected with lines L16 and L17. Consequently, the connection processing ends, upon which a display image showing the new connection of the output hot spot OT21 to the input hot spots IN31 and IN32 with lines L16 and L17 respectively is shown on the connection display section 20a as shown in the middle of FIG. 15. The attribute information of the third component C3 and the second component C2 is rewritten to the information that reflects the connection resulted from the above-mentioned connection processing. If the above-mentioned connection processing ends, the selected state of the output hot spots OT21 and OT23 of the selected second component C2 is not cleared. Thus, in the connection processing according to the third embodiment, the hot spot to be processed is only the output hot spot having the lowest number among the selected hot spots even if a plurality of hot spots are selected.

Because the selected state of the output hot spots OT21, OT22, and OT23 is not cleared, assume that the control key (Ctrl) and the "5" key be pressed at the same time in the state shown in the middle of FIG. 15. Then, the proximity component arranged to the right side of the second component C2 and having an unconnected input hot spot connectable to the output hot spot OT21 having the lowest number among the selected output hot spots of the second component C2 is detected. In this example, because the third component C3 has no unconnected input hot spot, the fourth component C4 is detected as the component to be connected. Next, so as to connect all unconnected input hot spots of the detected fourth component C4 to the output hot spot OT21 of the selected second component C2, all unconnected input hot spots IN41, In42, and IN43 on the left side on the detected fourth component C4 are subjected to processing and, at the same time, the output hot spot OT21 of the selected second component C2 is subjected to processing, these target hot spots being interconnected with lines L18, L19, and L20 respectively.

Consequently, the connection processing ends, upon which a display image showing the connection of the output hot spot OT21 to the input hot spots IN31 and IN32 and to the input hot spots IN41, IN42, and IN43 with lines L16 through L20 respectively is shown on the connection display section 20a as shown in the lower portion of FIG. 15. The attribute information of the third component C3 and the second component C2 is rewritten to the information that reflects the connection resulted from the above-mentioned connection processing. It should be noted that, if the connection processing ends, the selected state of the output hot spots OT21, OT22, OT23 of the selected second component C2 is not cleared as shown in the lower portion of FIG. 15. Thus, in the connection processing according to the third embodiment, the hot spot to be processed is only the output hot spot having the lowest number if a plurality of hot spots are selected.

Upon the end of the above-mentioned connection processing according to any one of the first embodiment, the second embodiment, and the third embodiment, the component attribute information shown in FIG. 4 stored in the current buffer is transmitted from the computer (PC) 2 to the DSP (mixer engine). Consequently, in the DSP (mixer engine) on which signal routine has been executed by the computer (PC) 2 that is the signal routing apparatus according to the present invention, the logical connection between components is executed in accordance with the transmitted component attribute information. The computer (PC) 2 executes connection processing by making the each of the plurality of DSPs (mixer engines) 3 through 6 constituting the mixing system 1 subject to signal routing and sets signal routes to each of the DSPs (mixer engines) 3 through 6. The signal routes thus set are held in each of the DSPs (mixer engines); therefore, if the computer (PC) 2 is disconnected from the mixing system 1 after the signal route setting, the mixing system 1 based on the plurality of DSPs (mixer engines) is capable of executing predetermined operations on the basis of the signal routes held therein.

As described above, the connection processing according to the invention allows the automatic connection between the input hot spots and output hot spots of different components. Also, the signal routing apparatus according to the invention allows the user to manually provide connection between the input hot spots and output hot spots of different components. In the manual mode, a line is drawn from an input/output hot spot of the source of connection to an input/output hot spot of the destination of connection or an input/output hot spot to be connected and an input/output hot spot of the connection mate are selected and the selection is entered, thereby interconnecting the input/output hot spots of the connection source and the connection destination.

Figure 16:
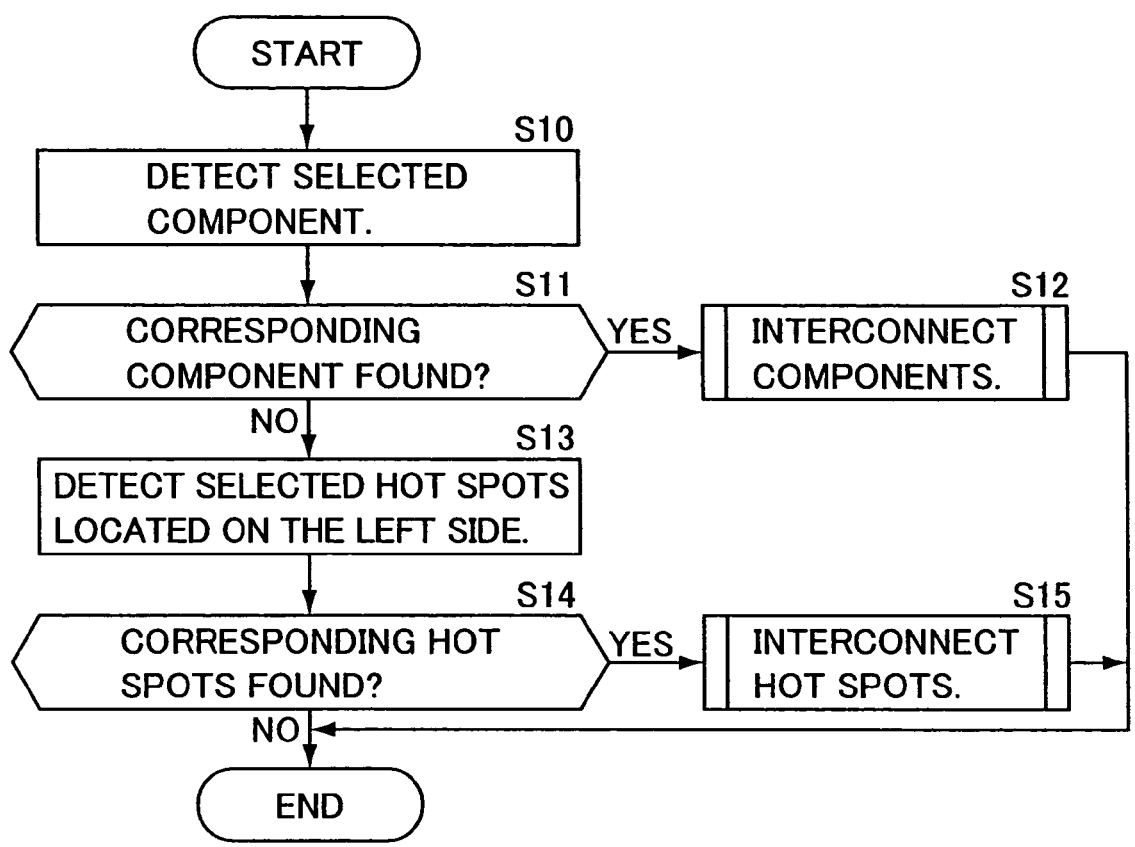
FIG. 16 is a flowchart indicative of connection processing executed by a computer (PC) on which a signal routing program according to the invention is installed.

Now, referring to FIG. 16, there is shown a flowchart indicative of the connection processing to be executed by the computer (PC) 2 on which the signal routing program according to the invention is installed.

The connection processing shown in FIG. 16 starts when a component specified by clicking the pointing device for example is set as a selected component or a hot spot specified by clicking the pointing device for example is set as a selected hot spot and the automatic connection of the left side (namely, the input hot spot) of the component is directed (by simultaneously pressing the control key (Ctrl) and the "1" key). In this case, however, a plurality of components cannot be set as selected components, but a plurality of hot spots can be selected as selected hot spots at the same time.

When the connection processing starts, detection of a selected component is made in step S10. In step S11, it is determined whether there is any selected component or not. If a selected component is found, then the procedure goes to step S12, in which component connection processing is executed, thereby executing the connection processing according to the first embodiment shown in FIG. 6 through FIG. 10. Namely, an unconnected input hot spot of the selected component is automatically connected to an output hot spot of the proximity component arranged to the left side of the former component. If no selected component is found, the procedure goes to step S13, in which an input hot spot on the left side among the selected hot spots is detected. In step S14, it is determined whether a corresponding hot spot has been detected in step S13. If a corresponding hot shot is found detected, then the procedure goes to step S14, in which hot spot connection processing is executed, thereby executing the connection processing according to the second embodiment shown in FIG. 11 through FIG. 13. Namely, an unconnected input hot spot among the selected hot spots is automatically connected to an unconnected output hot spot of the proximity component arranged to the left side of the former component.

When the component connection processing in step S12 or the hot spot connection processing in step S15 ends or if no hot spot is detected in step S14, then the connection processing ends.

Figure 17:
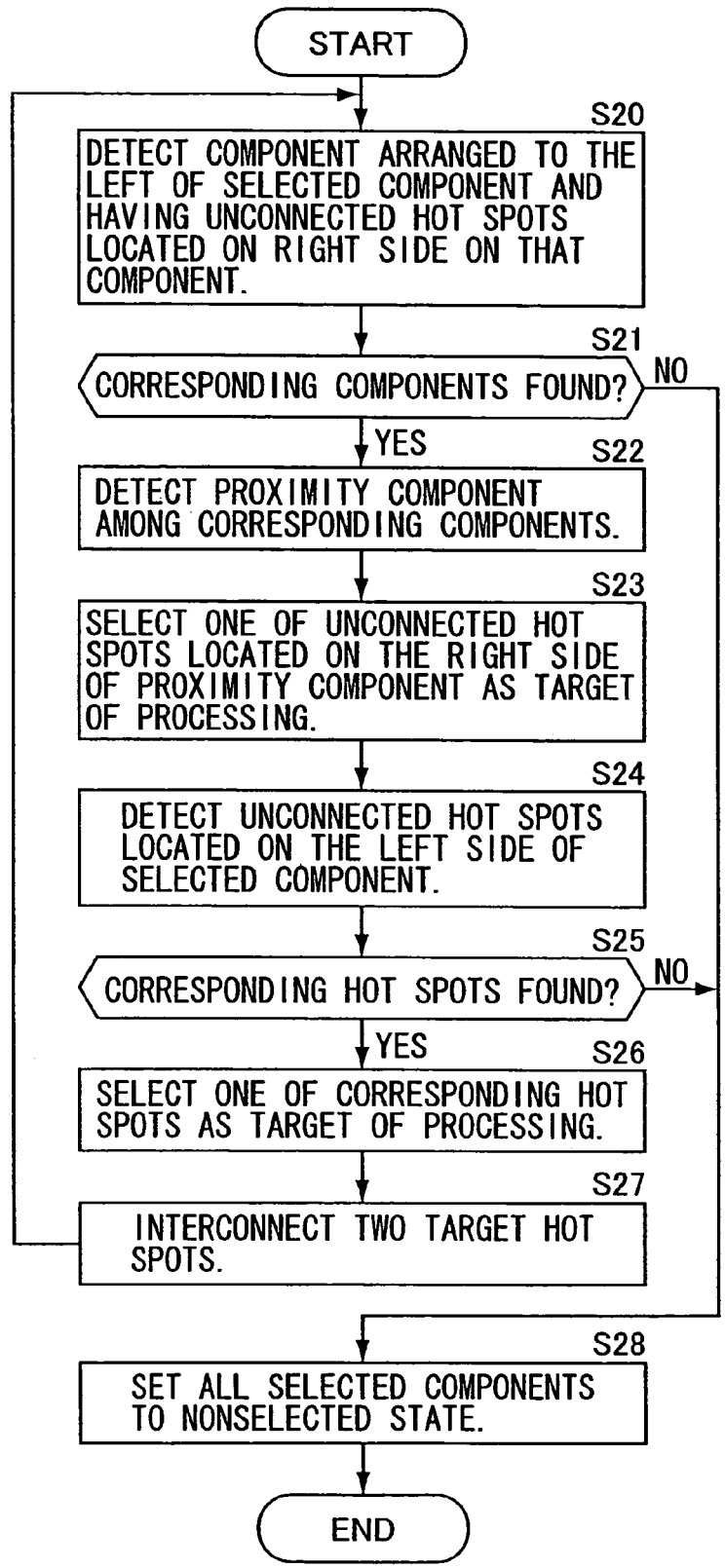
FIG. 17 is a flowchart indicative of component connection processing executed by the computer (PC) on which the signal routing program according to the invention is installed.

Referring to FIG. 17, there is shown a flowchart indicative of the component connection processing to be executed in step S21 in the connection processing.

When the component connection processing starts, the component arranged to the left side of the component selected in the connection display section 20a and having an unconnected output hot spot on the right side is detected in step S20. In step S21, it is determined whether the corresponding component has been detected or not. If the corresponding component is found detected, then the procedure goes to step S22, in which the proximity component among the corresponding components is detected. In this case, distances between the reference coordinate of the selected component and the reference coordinates of the detected components are computed and the component having the shortest distance is detected as the proximity component. In step S23, one of the output hot spots on the right side on the detected proximity component is subjected to processing. In this case, the output hot spot having the lowest number among the unconnected output hot spots or the output hot spot located on top thereof may be subjected to processing.

In step S24, an unconnected input hot spot on the left side on the selected component is detected. In step S25, it is determined whether corresponding input hot spots have been detected or not. If the corresponding input hot spots are found detected, the procedure goes to step S26, in which one of the corresponding input hot spots is subjected to processing. In this case, the input hot spot having the lowest number among the detected unconnected input hot spots or the input hot spot located on top thereof may be subjected to processing. In step S27, the 2 hot spots subjected to processing in step S23 and step S26 are connected with each other. When the processing in step S27 ends, the procedure returns to step S20. The processing of step 20 through step 27 is repeatedly executed as far as the corresponding components are found detected in step S21 and the corresponding hot spots are found detected in step S25, sequentially executing automatic connection between the 2 unconnected hot spots subjected to processing. If no corresponding component is found detected in step S21 or step S25, then the procedure goes to step S28, in which all selected components are put in the deselected state, upon which the component connection processing ends.

Figure 18:
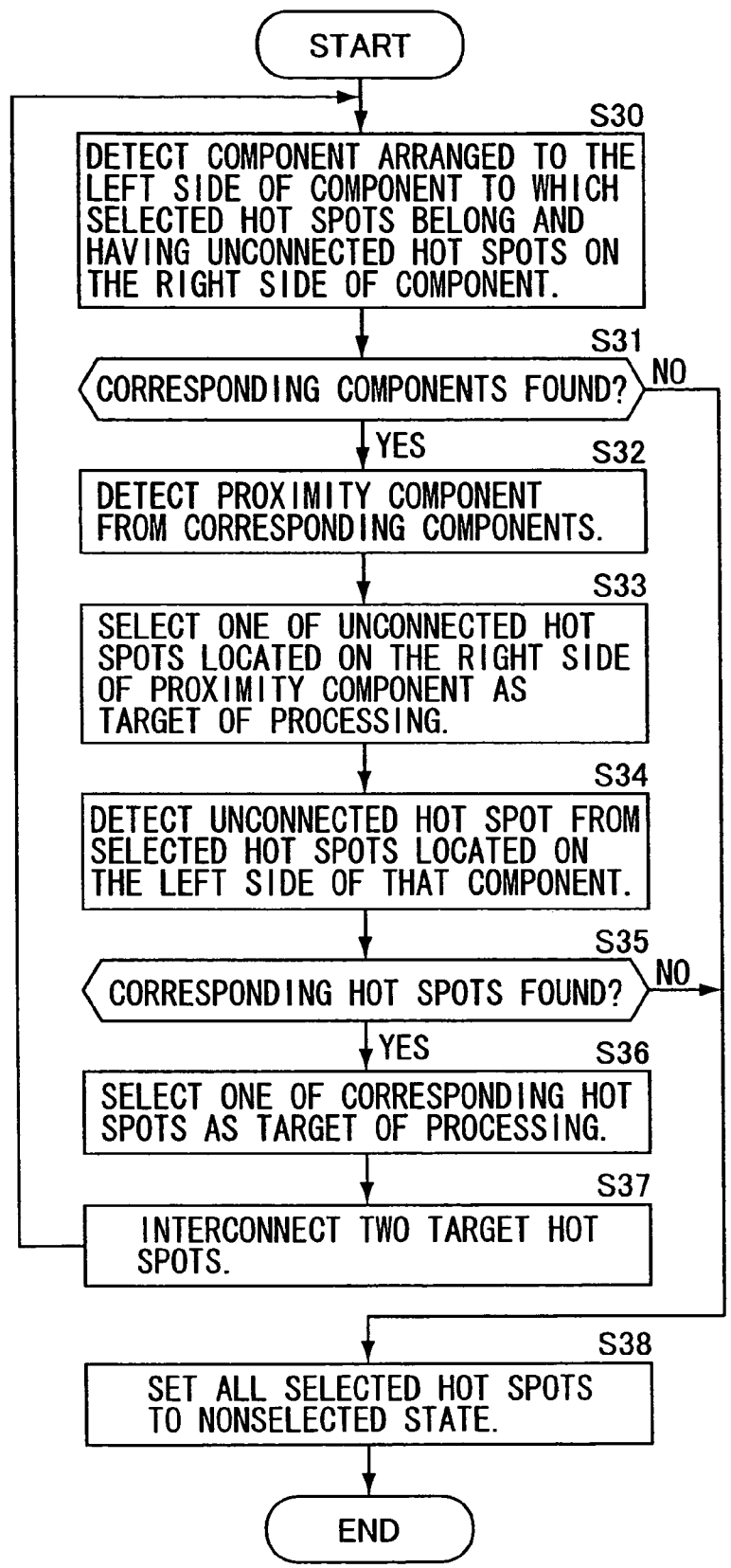
FIG. 18 is a flowchart indicative of terminal connection processing executed by the computer (PC) on which the signal routing program according to the invention is installed.

Referring to FIG. 18, there is shown a flowchart indicative of the hot spot connection processing to be executed in step S12 in connection processing.

When the hot spot connection processing starts, the component arranged to the left side of the component to which the hot spots selected in the connection display section 20a belong and having an unconnected hot spot on the right side is detected in step S30. In step S31, it is determined whether the corresponding components have been detected or not in step S30. If the corresponding components are found detected, then the procedure goes to step S32, in which one proximity component among the detected corresponding components is detected. In this case, distances between the reference coordinate of the component to which the selected hot spots belong and the reference coordinates of the detected components are computed and the component having the shortest distance is detected as the proximity component. Next, in step S33, one of the output hot spots on the right side on the detected proximity component is subjected to processing. In this case, the output hot spot having the lowest number among the unconnected output hot spots or the output hot spot located on top thereof may be subjected to processing.

In step S34, detection of unconnected input hot spots among the selected hot spots is executed. In step S35, it is determined whether the corresponding input hot spots have been detected or not. If the corresponding input hot spots are found detected, then the procedure goes to step S36, in which one of the corresponding input hot spots is subjected to processing. In this case, the input hot spot having the lowest number among the detected unconnected input hot spots or the input hot spot located on top thereby may be subjected to processing. Next, in step S37, the 2 hot spots subjected to processing in step S33 and step S36 are connected with each other. When the processing of step S37 ends, then the procedure returns to step S30. The processing of step 30 through step 37 is repeatedly executed as far as the corresponding components are found detected in step S31 and the corresponding hot spots are found detected in step S55, sequentially executing automatic connection between the 2 unconnected hot spots subjected to processing. If no corresponding component is found detected in step S31 or step S35, then the procedure goes to step S38, in which all selected components are put in the deselected state, upon which the component connection processing ends.

Referring to FIG. 19, there is shown a flowchart indicative of special connection processing that is the connection processing according to the third embodiment to be executed by the computer (PC) 2 on which the signal routing program according to the invention is installed.

The special connection processing shown in FIG. 19 starts when a hot shot specified by clicking the pointing device for example is sets a selected hot spot and automatic connection is directed (by simultaneously pressing the control key (Ctrl) and the "5" key). In this case, a plurality of hot pots may be set as selected hot spots at the same time.

When the special connection processing starts, output hot spots on the right side of the component to which the selected hot spots belong is detected in step S40. Next, in step S41, it is determined whether the corresponding output hot spots have been detected or not in step S40. If the corresponding output hot spots are found detected, then the procedure goes to step S42, in which the component arranged to the right side of the component to which the selected hot spots belong in the connection display section 20a and has an unconnected input hot spot on the left side is detected. Next, in step S42, it is determined whether the corresponding components have been detected.

If the corresponding components are found detected, then the procedure goes to step S44, in which one proximity component among the corresponding component is detected. In this case, distances between the reference coordinate of the component to which the selected hot spots belong and the reference coordinates of the detected components is computed and the component having the shortest distance is detected as the proximity component. Next, in step S44, all unconnected input hot spots on the left side of the detected proximity component are subjected to processing. In step S47, one output hot spot on the right side among the selected hot spots is subjected to processing, thereby automatically connecting one output hot spot subjected to processing to all input hot spots subjected to processing. The above-mentioned one output hot spot subjected to processing may be the output hot spot having the lowest number among the output hot spots or the output hot spot located on top thereof. Consequently, the special connection processing ends. If no corresponding component is found detected in step S41 or step S43, then the special connection processing ends at that moment.

The flowcharts shown in FIG. 16 through FIG. 18 are indicative of the automatic connection in which selected components and selected hot spots are the input hot spots located on the left side of each component, and a component having the output hot spots to be automatically connected to these input hot spots is detected for automatic connection. The flowcharts indicative of the connection processing that starts when automatic connection is instructed (by simultaneously pressing the control key (Ctrl) and the "2" key) are not shown in the specification. Such a flowchart may indicate that the selected hot spots located on the right side of selected component provide the output hot spots and the component having input hot spots to be automatically connected to these output hot spots is detected for automatic connection. Namely, the flowcharts in this case are equivalent to the flowchart shown in FIG. 16 through FIG. 18 with right side/left side of each component inverted on which hot spots are located and the right side/left side inverted on which each component is arranged next to another component.

In the above-mentioned signal routing apparatus according to the invention, the means of instructing connection is not restricted to the pointing device; for example, it is also practicable to instruct connection with a particular key such as a numeric key. In this case, it is preferable to make the instruction of connection with a single key operation.

If a hot spot is selected to execute connection processing, it is also practicable to use an operation method in which the instruction for connecting to the component to the left side and the instruction for connecting to the component to the right side are executed in the same manner rather than different manners. In this configuration, when these operations are detected, whether the selected hot spots are located on the left side or the right side on the component is detected. If the selected hot spots are found located on the left side on the component, connection to the left side may be executed. If the selected hot spots are found located on the right side on the component, connection to the right side may be executed. If the selected hot spots are located on both sides on the component, the hot spots on both sides are sequentially connected. Alternatively, the user may determine the connection processing of which side is to be executed, thereby executing only the connection of the selected side. The connection processing in which selected hot spots are located on both sides on a component is also applicable to the connection processing of the first embodiment in which components are selected for connection processing.

Further, the special connection processing is exceptional, in which connection is made only in one direction, from the right-side hot spots to the left-side hot spots.

It is assumed herein that connection be always made between the output hot spots (namely, the signal source) located on the right side on the component and the input hot spots (namely, the signal destination) located on the left side on the component. In this case, connection is not made between the hot spots located on the same side. Thus, the right side and the left side of each component correspond to signal in and out terminals, so that any actually impossible connections, from in to in or from out to out, are automatically excluded.

In the above description, the right side of each component accommodate output hot spots and the left side accommodates input hot spots. It is also practicable that the right side of each component accommodate input hot spots and the left side accommodate output hot spots. In this case, the connection processing is made with right and left exchanged for automatic connection.

In the above-mentioned connection processing, it is also practicable, in the selection of hot spots of the destination of connection, to give a reference coordinate to each hot spot to compute distances between hot spots (namely, between reference coordinates), thereby selecting the component having the shortest distance as the hot spot of the destination of connection. Further, in the selection of hot spots of the destination of connection, a reference coordinate may be given to each hot spot to compute distances between hot spots (namely, between reference coordinates), thereby selecting the component to which the hot spots having the shortest distance belongs. Then, the hot spot having the lowest number among the unconnected hot spots including in the selected component may be selected as the hot spot of the destination of connection.

In the computation of distances for selecting a destination component or hot spot, one component may use hot spot's reference coordinates while another component may use component's reference coordinates.

If the signal routing program is not stored in the ROM 11, the signal routing program and necessary data may be stored in a hard disk or a CD-ROM. The signal routing program and necessary data may be loaded into the RAM 12 for the execution by the CPU 10 or the signal routing program and necessary data may be downloaded from a server computer via a communication network for the execution by the CPU 10 in the same manner as the signal routing program and necessary data are stored in the ROM 11.

In the foregoing, the present invention has been described as a signal routing apparatus and a signal routing program for use in a mixing system. The signal routing apparatus and signal routing program according to the invention is also applicable as a signal routing apparatus and a signal routing program for use in general electronic equipment for executing automatic connection between the terminals of displayed functional circuits.

The invention claimed is:

1. A signal routing apparatus for setting a signal route among a plurality of components of a signal processing system, comprising:
    a display part that displays a plurality of components each having at least one terminal for connection;
    an operator part that is operated by a user to select at least one terminal of one component at a source side of the connection on the display part;
    another operator part that is operated by the user to input an instruction for automatic connection;
    a detection part that responds to the instruction for automatic connection for detecting at least one terminal of another component at a destination side of the connection, which is automatically connectable to the selected terminal; and
    a connection part that automatically connects the selected terminal of said one component at the source side of the connection and the detected terminal of said another component at the destination side of the connection with one another so that a line is drawn on the display part between the selected terminal and the detected terminal, thereby setting the signal route among the components in the form of lines drawn between the terminals of the components on the display part.

2. The signal routing apparatus according to claim 1, wherein the detection part detects at least one terminal of another component which is automatically connectable to the selected terminal, such that the detected terminal is located on said another component which is arranged most closely to said one component on the display part.

3. The signal routing apparatus according to claim 1, wherein the operator part is operated to select one or more terminals of one component, the detection part detects one or more terminals of another component, which is automatically connectable to the selected terminals in one to one correspondence, and the connection part automatically connects each of the selected terminals of said one component and each of the detected terminals of said another component by drawing each line between a corresponding pair of each selected terminal and each detected terminal.

4. The signal routing apparatus according to claim 1, wherein the display part displays the plurality of the components having two types of the terminals as input side and output side, the operator part inputs the instruction to specify one of the two types and thus selects the terminal of the one type specified by the instruction, the detection part detects the terminal of the other type according to the instruction as being connectable to the selected terminal, and the connection part automatically connects the selected terminal of the one type and the detected terminal of the other type with each other so that the signal route is set between the terminals of the input side and the terminals of the output side.

5. The signal routing apparatus according to claim 1, wherein the operator part comprises a keyboard having a plurality of keys such that a set of specific keys are operated in combination to input the instruction for connection.

6. The signal routing apparatus according to claim 5, wherein the set of the specific keys is a combination of a function key and one of numeric keys, so that the function key is operated to enable inputting of the instruction and different numeric keys are selectively operated to specify detail of the instruction for connection.

7. A signal routing apparatus for setting a signal route among a plurality of components of a signal processing system, comprising:
    a display part that displays a plurality of components each having at least one terminal for connection;
    an operator part that is operated by a user to select one component at a source side of the connection on the display part;
    another operator part that is operated by the user to input an instruction for specifying a mode of automatic connection;
    a detection part that responds to the instruction for automatic connection for detecting another component at a destination side of the connection which is automatically connectable to the selected component at the source side of the connection; and
    a connection part that automatically connects at least one terminal contained in the selected component at the source side of the connection and at least one terminal contained in the detected component at the destination side of the connection with each other according to the instruction so that a line is drawn on the display part between the terminal of the selected component at the source side of the connection and the terminal of the detected component at the destination side of the connection, thereby setting the signal route among the components in the form of lines drawn between the terminals of the components on the display part.

8. The signal routing apparatus according to claim 7, wherein the detection part detects another component which is arranged most closely to the selected one component on the display part as being connectable to the selected component.

9. The signal routing apparatus according to claim 7, wherein the connection part automatically connects one or more of terminals contained in the selected component and one or more of terminals contained in the detected component with each other according to the instruction so that each line is drawn on the display part between each terminal of the selected component and each terminal of the detected component in one to one correspondence.

10. The signal routing apparatus according to claim 7, wherein the display part displays a plurality of components having two types of the terminals as input side and output side, the operator part inputs the instruction to specify one of the two types, and the connection part automatically connects the terminal of the one type contained in the selected component and the terminal of the other type contained in the detected component according to the instruction so that the signal route is set between the terminals of the input side and the terminals of the output side.

11. The signal routing apparatus according to claim 7, wherein the operator part comprises a keyboard having a plurality of keys such that a set of specific keys are operated in combination to input the instruction for connection.

12. The signal routing apparatus according to claim 11, wherein the set of the specific keys is a combination of a function key and one of numeric keys, so that the function key is operated to enable inputting of the instruction and different numeric keys are selectively operated to specify the mode of the instruction for connection.

13. A signal routing apparatus for setting a signal route among a plurality of components of a signal processing system, comprising:
  a display part that displays a plurality of components each having at least one terminal for connection;
  an operator part that is operated by a user to select at least one terminal of one component at a source side of the connection on the display part;
  another operator part that is operated by the user to input an instruction for automatic connection;
  a detection part that responds to the instruction for automatic connection for detecting a multiple of terminals of another component at a destination side of the connection, which is automatically connectable to the selected one terminal; and
  a connection part that automatically connects the selected one terminal of said one component at the source side of the connection and the multiple of the detected terminals of said another component at the destination side of the connection with one another so that a multiple of lines are drawn on the display part from the selected one terminal to the multiple of the detected terminals, thereby setting the signal route among the components in the form of lines drawn between the terminals of the components on the display part.

14. The signal routing apparatus according to claim 13, wherein the operator part comprises a keyboard having a plurality of keys such that a set of specific keys are operated in combination to input the instruction for connection.

15. The signal routing apparatus according to claim 14, wherein the set of the specific keys is a combination of a function key and one of numeric keys, so that the function key is operated to enable inputting of the instruction and different numeric keys are selectively operated to specify detail of the instruction for connection.

16. A computer readable storage medium having a series of instructions executable by a computer having a display device for performing a method of setting a signal route among a plurality of components of a signal processing system, wherein the method comprises the steps of:
  displaying a plurality of components on the display device such that each component has at least one terminal for connection;
  selecting at least one terminal of one component at a source side of the connection on the display device;
  inputting an instruction for automatic connection;
  detecting at least one terminal of another component at a destination side of the connection, which is automatically connectable to the selected terminal according to the instruction for automatic connection; and
  automatically connecting the selected terminal of said one component at the source side of the connection and the detected terminal of said another component at the destination side of the connection with one another so that a line is drawn on the display device between the selected terminal and the detected terminal, thereby setting the signal route among the components in the form of lines drawn between the terminals of the components on the display device.

17. A computer readable storage medium having a series of instructions executable by a computer having a display device for performing a method of setting a signal route among a plurality of components of a signal processing system, wherein the method comprises the steps of:
  displaying a plurality of components on the display device such that each component has at least one terminal for connection;
  selecting one component at a source side of the connection on the display device;
  inputting an instruction for specifying a mode of automatic connection;
  detecting another component at a destination side of the connection which is automatically connectable to the selected component according to the instruction for automatic connection; and
  automatically connecting at least one terminal contained in the selected component at the source side of the connection and at least one terminal contained in the detected component at the destination side of the connection with each other according to the instruction so that a line is drawn on the display device between the terminal of the selected component at the source side of the connection and the terminal of the detected component at the destination side of the connection, thereby setting the signal route among the components in the form of lines drawn between the terminals of the components on the display device.

18. A computer readable storage medium having a series of instructions executable by a computer having a display device for performing a method of setting a signal route among a plurality of components of a signal processing system, wherein the method comprises the steps of:
  displaying a plurality of components on the display device such that each component has at least one terminal for connection;
  selecting at least one terminal of one component at a source side of the connection on the display device;
  inputting an instruction for automatic connection;
  detecting a multiple of terminals of another component at a destination side of the connection which is automatically connectable to the selected one terminal according to the instruction for automatic connection; and
  automatically connecting the selected one terminal of said one component at the source side of the connection and the multiple of the detected terminals of said another component at the destination side of the connection with one another so that a multiple of lines are drawn on the display device from the selected one terminal to the multiple of the detected terminals, thereby setting the signal route among the components in the form of lines drawn between the terminals of the components on the display device.

* * * * *